(12) United States Patent
Shiraishi et al.

(10) Patent No.: US 12,150,233 B2
(45) Date of Patent: Nov. 19, 2024

(54) TARGET SUBSTANCE REPLENISHMENT DEVICE, EXTREME ULTRAVIOLET LIGHT GENERATION APPARATUS, AND ELECTRONIC DEVICE MANUFACTURING METHOD

(71) Applicant: Gigaphoton Inc., Tochigi (JP)

(72) Inventors: Yutaka Shiraishi, Oyama (JP); Hideki Shishiba, Oyama (JP)

(73) Assignee: Gigaphoton Inc., Tochigi (JP)

( * ) Notice: Subject to any disclaimer, the term of this patent is extended or adjusted under 35 U.S.C. 154(b) by 414 days.

(21) Appl. No.: 17/831,255

(22) Filed: Jun. 2, 2022

(65) Prior Publication Data

US 2023/0008733 A1 Jan. 12, 2023

(30) Foreign Application Priority Data

Jul. 12, 2021 (JP) .................. 2021-114988

(51) Int. Cl.
  *H05G 2/00* (2006.01)
  *G03F 7/00* (2006.01)
  *H01L 21/027* (2006.01)

(52) U.S. Cl.
  CPC ......... *H05G 2/008* (2013.01); *G03F 7/70033* (2013.01); *H01L 21/027* (2013.01); *H05G 2/006* (2013.01)

(58) Field of Classification Search
  CPC ........ H05G 2/008; H05G 2/006; H05G 2/005; H01L 21/027; G03F 7/70033
  See application file for complete search history.

(56) References Cited

U.S. PATENT DOCUMENTS

2013/0221587 A1* 8/2013 Shiraishi ................ H05G 2/006
                                                   266/200

FOREIGN PATENT DOCUMENTS

| JP | H06-054942 A | 3/1994 |
| JP | H10-314375 A | 12/1998 |
| JP | 2000-354652 A | 12/2000 |
| JP | 2002-177607 A | 6/2002 |
| JP | 2007014822 A * | 1/2007 |
| JP | 2015-053292 A | 3/2015 |

* cited by examiner

*Primary Examiner* — David E Smith
*Assistant Examiner* — Hsien C Tsai
(74) *Attorney, Agent, or Firm* — Studebaker & Brackett PC

(57) ABSTRACT

A target substance replenishment device may include a first container containing a solid target substance, a first path through which the solid target substance supplied from the first container passes, a first supply switching device switching between a first state where supply of the solid target substance from the first container to the first path is suppressed and a second state where the supply of the solid target substance from the first container to the first path is allowed, a first valve connected to the first path, a second path which is connected to the first valve and through which the solid target substance having passed through the first valve passes, a first detector outputting a first detection signal indicating that the second path is clogged with the solid target substance, and a processor controlling the first supply switching device to the first state based on the first detection signal.

20 Claims, 18 Drawing Sheets

TARGET SUBSTANCE REPLENISHMENT DEVICE, EXTREME ULTRAVIOLET LIGHT GENERATION APPARATUS, AND ELECTRONIC DEVICE MANUFACTURING METHOD

CROSS-REFERENCE TO RELATED APPLICATIONS

The present application claims the benefit of Japanese Patent Application No. 2021-114988, filed on Jul. 12, 2021, the entire contents of which are hereby incorporated by reference.

BACKGROUND

1. Technical Field

The present disclosure relates to a target substance replenishment device, an extreme ultraviolet light generation apparatus, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 70 to 45 nm and further at 32 nm or less will be required. Therefore, in order to meet the demand for fine processing of, for example, 32 nm or less, the development of an exposure apparatus that combines an extreme ultraviolet (EUV) light generation apparatus that generates EUV light having a wavelength of about 13 nm and reduced projection reflection optics is expected.

As an EUV light generation apparatus, three types of apparatuses have been proposed: a laser produced plasma (LPP) type apparatus using plasma generated by irradiating a target substance with pulse laser light, a discharge produced plasma (DPP) type apparatus using plasma generated by discharge, and a synchrotron radiation (SR) type apparatus using synchrotron radiation.

LIST OF DOCUMENTS

Patent Documents

Patent Document 1: Japanese Patent Application Publication No. 2015-053292
Patent Document 2: Japanese Patent Application Publication No. 2007-014822
Patent Document 3: Japanese Patent Application Publication No. 2000-354652
Patent Document 4: Japanese Patent Application Publication No. H06-054942
Patent Document 5: Japanese Patent Application Publication No. 2002-177607
Patent Document 6: Japanese Patent Application Publication No. H10-314375

SUMMARY

A target substance replenishment device according to an aspect of the present disclosure is for use in an extreme ultraviolet light generation apparatus which outputs extreme ultraviolet light by irradiating a target substance with pulse laser light to turn the target substance into plasma. The target substance replenishment device includes a first container configured to contain a solid target substance, a first path through which the solid target substance supplied from the first container passes, a first supply switching device capable of switching between a first state in which supply of the solid target substance from the first container to the first path is suppressed and a second state in which the supply of the solid target substance from the first container to the first path is allowed, a first valve connected to the first path, a second path which is connected to the first valve and through which the solid target substance having passed through the first valve passes, a first detector configured to output a first detection signal indicating that the second path is clogged with the solid target substance, and a processor configured to control the first supply switching device to the first state based on the first detection signal.

An electronic device manufacturing method according to an aspect of the present disclosure includes generating extreme ultraviolet light using an extreme ultraviolet light generation apparatus, emitting the extreme ultraviolet light to an exposure apparatus, and exposing a photosensitive substrate to the extreme ultraviolet light in the exposure apparatus to manufacture an electronic device. Here, the extreme ultraviolet light generation apparatus includes a target substance replenishment device; a third container configured to melt a solid target substance replenished by the target substance replenishment device to produce a molten target substance; a nozzle configured to output the molten target substance; a laser device configured to irradiate, with pulse laser light, the molten target substance reaching a predetermined region after being output from the nozzle; and an EUV light concentrating mirror configured to concentrate extreme ultraviolet light emitted from plasma generated in the predetermined region. The target substance replenishment device includes a first container configured to contain the solid target substance, a first path through which the solid target substance supplied from the first container passes, a first supply switching device capable of switching between a first state in which supply of the solid target substance from the first container to the first path is suppressed and a second state in which the supply of the solid target substance from the first container to the first path is allowed, a first valve connected to the first path, a second path which is connected to the first valve and through which the solid target substance having passed through the first valve passes, a first detector configured to output a first detection signal indicating that the second path is clogged with the solid target substance, and a processor configured to control the first supply switching device to the first state based on the first detection signal.

An electronic device manufacturing method according to an aspect of the present disclosure includes inspecting a defect of a mask by irradiating a mask with extreme ultraviolet light generated by an extreme ultraviolet light generation apparatus, selecting a mask using a result of the inspection, and exposing and transferring a pattern formed on the selected mask onto a photosensitive substrate. Here, the extreme ultraviolet light generation apparatus includes a target substance replenishment device; a third container configured to melt a solid target substance replenished by the target substance replenishment device to produce a molten target substance; a nozzle configured to output the molten target substance; a laser device configured to irradiate, with pulse laser light, the molten target substance reaching a predetermined region after being output from the nozzle; and an EUV light concentrating mirror configured to concentrate extreme ultraviolet light emitted from plasma generated in the predetermined region. The target substance replenishment device includes a first container configured to contain the solid target substance, a first path through which the solid target substance supplied from the first container passes, a first supply switching device capable of switching between a first state in which supply of the solid target substance from the first container to the first path is suppressed and a second state in which the supply of the solid target substance from the first container to the first path is allowed, a first valve connected to the first path, a second path which is connected to the first valve and through which the solid target substance having passed through the first valve passes, a first detector configured to output a first detection signal indicating that the second path is clogged with the solid target substance, and a processor configured to control the first supply switching device to the first state based on the first detection signal.

BRIEF DESCRIPTION OF THE DRAWINGS

Embodiments of the present disclosure will be described below merely as examples with reference to the accompanying drawings.

DESCRIPTION OF EMBODIMENTS

Figure 1:
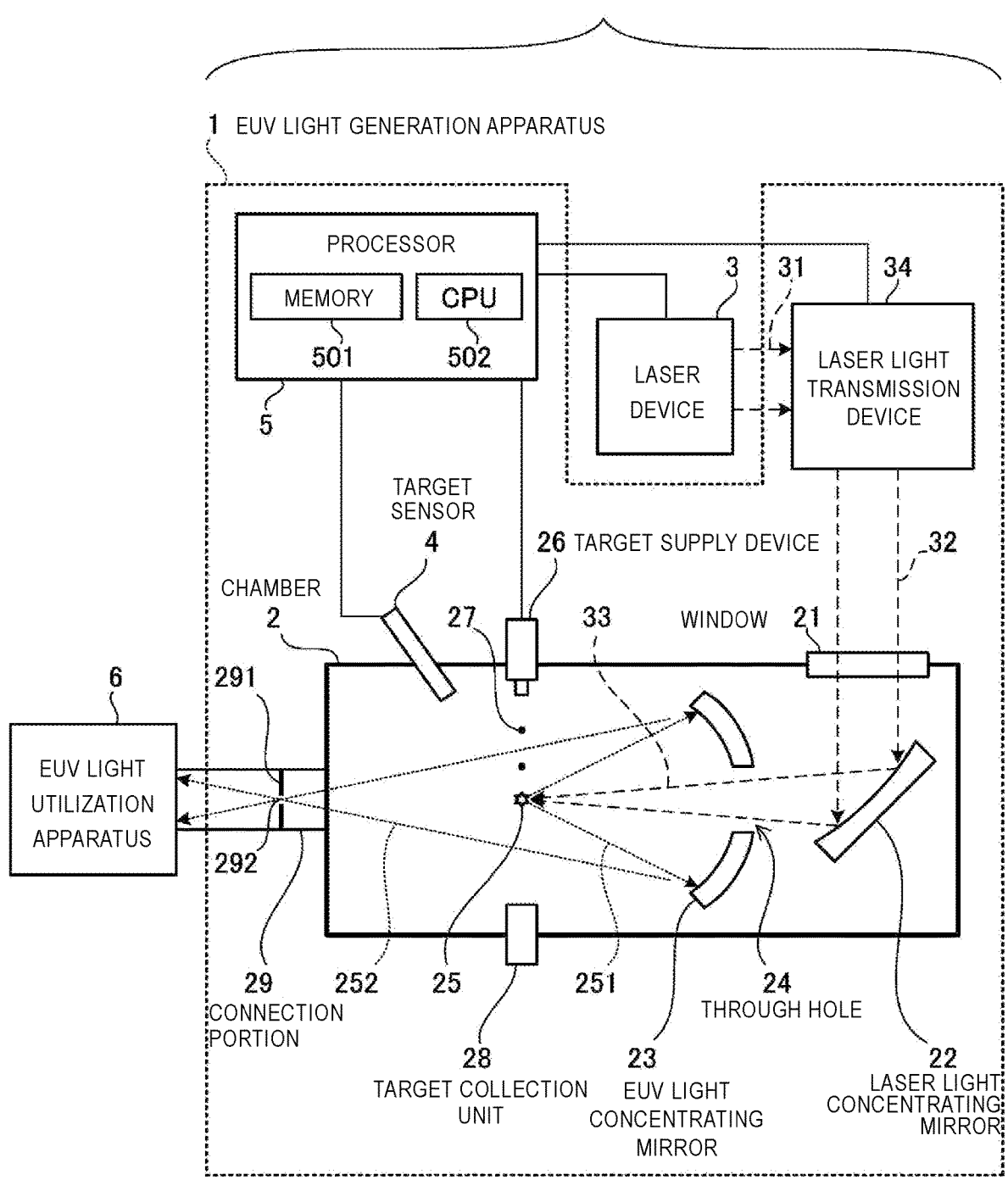
FIG. 1 schematically shows an exemplary configuration of an LPP EUV light generation system.

<Content>
1. Overall description of EUV light generation system 11
   1.1 Configuration
   1.2 Operation
2. Comparative example
   2.1 Configuration
      2.1.1 Reservoir tank C1
      2.1.2 Load lock chamber C2
      2.1.3 Pressure tank C3
   2.2 Operation
   2.3 Problem
3. Target supply device 26 which stops supply of solid target substance 27a when clogging has occurred with solid target substance 27a
   3.1 Configuration
   3.2 Operation
      3.2.1 Replenishment of solid target substance 27a
      3.2.2 Detection of clogging with solid target substance 27a
   3.3 Modification
   3.4 Effect
4. Target supply device 26 which activates vibration devices 91 to 93 when clogging has occurred with solid target substance 27a
   4.1 Configuration
   4.2 Detection of clogging with solid target substance 27a
   4.3 Effect
5. Target supply device 26 including joints F1, F2, M1, M2 for removing valve V1
   5.1 Configuration
   5.2 Operation
   5.3 Effect
6. Target supply device 26 including joints F3 to F6 and M3 to M6 for removing load lock chamber C2 and valve V2
   6.1 Configuration
   6.2 Operation
   6.3 Effect
7. Target supply device 26 including joints F1 to F6 and M1 to M6 and vibration devices 91 to 93
   7.1 Configuration
   7.2 Operation
8. Configuration example of detector 81
   8.1 Eddy-current detector 81a
      8.1.1 Configuration
      8.1.2 Effect
   8.2 Capacitive detector 81b
      8.2.1 Configuration
      8.2.2 Effect
   8.3 Optical detector 81d
      8.3.1 Configuration
      8.3.2 Effect
   8.4 Detector 81i including optical fibers 81j, 81k
      8.4.1 Configuration
      8.4.2 Effect
9. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overall Description of EUV Light Generation System 11

1.1 Configuration

FIG. 1 schematically shows an exemplary configuration of an LPP EUV light generation system 11. An EUV light generation apparatus 1 is used together with a laser device 3. In the present disclosure, a system including the EUV light generation apparatus 1 and the laser device 3 is referred to as the EUV light generation system 11. The EUV light generation apparatus 1 includes a chamber 2 and a target supply device 26. The chamber 2 is a sealable container. The target supply device 26 supplies a target substance into the chamber 2. The material of the target substance may include tin, terbium, gadolinium, lithium, xenon, or a combination of any two or more thereof.

A through hole is formed in a wall of the chamber 2. The through hole is blocked by a window 21 and pulse laser light 32 output from the laser device 3 passes through the window 21. An EUV light concentrating mirror 23 having a spheroidal reflection surface is arranged in the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 is arranged such that the first focal point is located in a plasma generation region 25 and the second focal point is located at an intermediate focal point 292. A through hole 24 is formed at the center of the EUV light concentrating mirror 23, and pulse laser light 33 passes through the through hole 24.

The EUV light generation apparatus 1 includes a processor 5, a target sensor 4, and the like. The processor 5 is a processing device including a memory 501 in which a control program is stored and a central processing unit (CPU) 502 which executes the control program. The processor 5 is specifically configured or programmed to perform various processes included in the present disclosure. The target sensor 4 detects at least one of the presence, trajectory, position, and velocity of a target 27. The target sensor 4 may have an imaging function.

Further, the EUV light generation apparatus 1 includes a connection portion 29 providing communication between the internal space of the chamber 2 and the internal space of an EUV light utilization apparatus 6. An example of the EUV light utilization apparatus 6 will be described later with reference to FIGS. 20 and 21. A wall 291 in which an aperture is formed is arranged in the connection portion 29. The wall 291 is arranged such that the aperture is located at the second focal point of the EUV light concentrating mirror 23.

Further, the EUV light generation apparatus 1 includes a laser light transmission device 34, a laser light concentrating mirror 22, a target collection unit 28 for collecting the target 27, and the like. The laser light transmission device 34 includes an optical element for defining a transmission state of laser light, and an actuator for adjusting the position, posture, and the like of the optical element.

1.2 Operation

Operation of the EUV light generation system 11 will be described with reference to FIG. 1. Pulse laser light 31 output from the laser device 3 enters, via the laser light transmission device 34, the chamber 2 through the window 21 as pulse laser light 32. The pulse laser light 32 travels along a laser light path in the chamber 2, is reflected by the laser light concentrating mirror 22, and is radiated to the target 27 as pulse laser light 33.

The target supply device 26 outputs the target 27 containing the target substance toward the plasma generation region 25 in the chamber 2. The target 27 is irradiated with the pulse laser light 33. The target 27 irradiated with the pulse laser light 33 is turned into plasma, and radiation light 251 is radiated from the plasma. EUV light included in the radiation light 251 is reflected by the EUV light concentrating mirror 23 with higher reflectance than light in other wavelength ranges. Reflection light 252 including the EUV light reflected by the EUV light concentrating mirror 23 is concentrated at the intermediate focal point 292 and output to the EUV light utilization apparatus 6. Here, one target 27 may be irradiated with a plurality of pulses included in the pulse laser light 33.

The processor 5 controls the entire EUV light generation system 11. The processor 5 processes a detection result of the target sensor 4. Based on the detection result of the target sensor 4, the processor 5 controls timing at which the target 27 is output, an output direction of the target 27, and the like. Further, the processor 5 controls oscillation timing of the laser device 3, a travel direction of the pulse laser light 32, the concentration position of the pulse laser light 33, and the like. The above-described various kinds of control are merely examples, and other control may be added as necessary.

2. Comparative Example

2.1 Configuration

Figure 2:
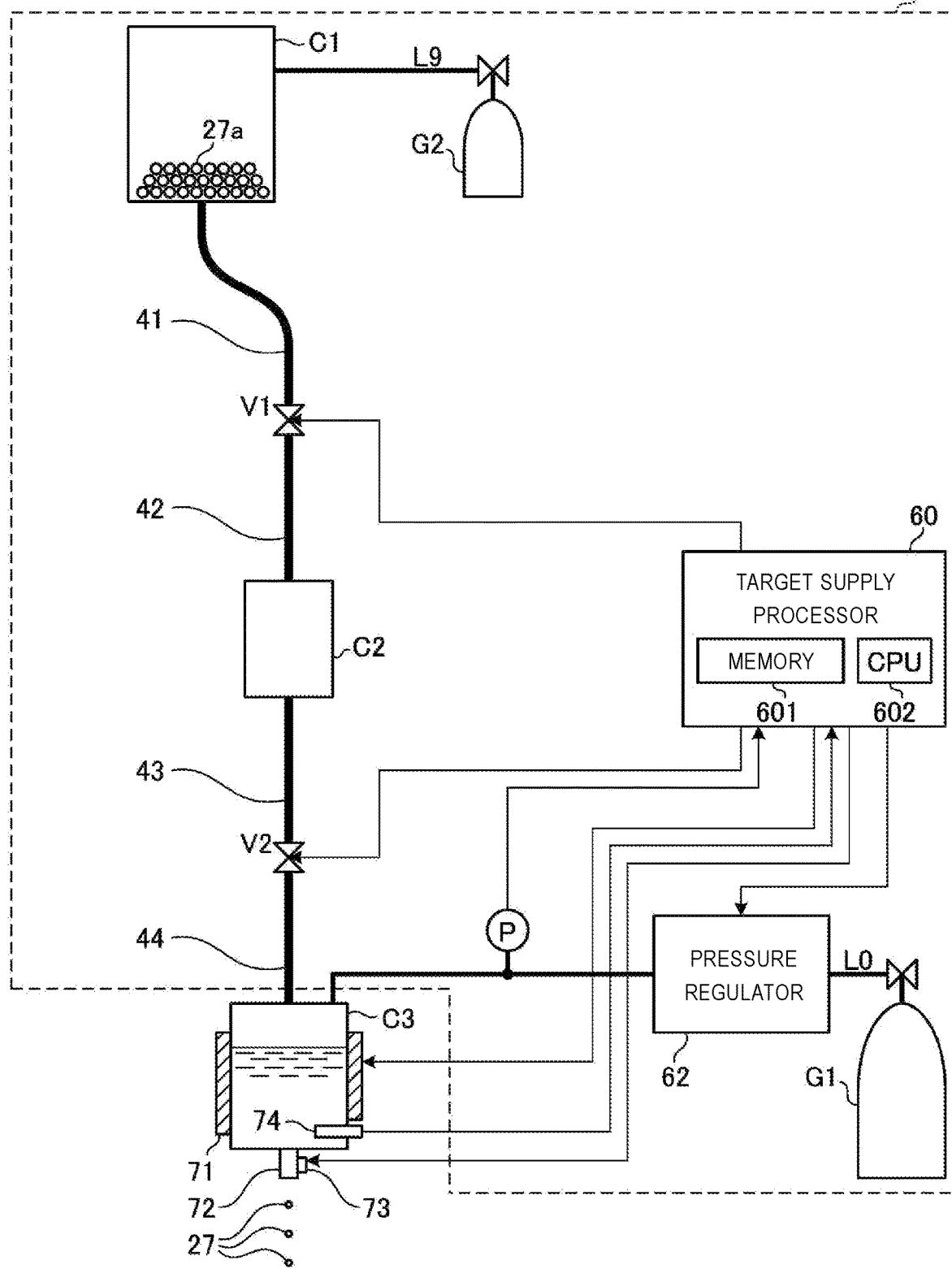
FIG. 2 schematically shows the configuration of a target supply device according to a comparative example.

FIG. 2 schematically shows the configuration of the target supply device 26 according to a comparative example. The comparative example of the present disclosure is an example recognized by the applicant as known only by the applicant, and is not a publicly known example admitted by the applicant. As shown in FIG. 2, the target supply device 26 according to the comparative example includes a target substance replenishment device 26a and a pressure tank C3. The target substance replenishment device 26a includes a reservoir tank C1, a load lock chamber C2, a target supply processor 60, supply pipes 41 to 44, gas cylinders G1, G2, and a pressure regulator 62.

The target supply processor 60 is a processing device including a memory 601 in which a control program is stored and a CPU 602 which executes the control program. The target supply processor 60 corresponds to the processor in the present disclosure. The target supply processor 60 is specifically configured or programmed to perform various processes included in the present disclosure.

2.1.1 Reservoir Tank C1

The reservoir tank C1 is a container containing the solid target substance 27a such as tin. The solid target substance 27a may be, for example, spherical particles of substantially the same size. The reservoir tank C1 corresponds to the first container in the present disclosure. The temperature in the reservoir tank C1 is lower than the melting point of the target substance. The reservoir tank C1 is connected to a gas cylinder G2 via a pipe L9. The gas cylinder G2 contains a rare gas such as an argon gas or a helium gas as a purge gas. The purge gas contained in the gas cylinder G2 is supplied to the inside of the reservoir tank C1. The pressure in the reservoir tank C1 is substantially equal to the atmospheric pressure.

The reservoir tank C1 is connected to the load lock chamber C2 via the supply pipes 41, 42. A valve V1 is connected between the supply pipes 41, 42. The supply pipes 41, 42 correspond to the first and second paths in the present disclosure, respectively, and the valve V1 corresponds to the first valve in the present disclosure.

2.1.2 Load Lock Chamber C2

The load lock chamber C2 is a container to contain the solid target substance 27a supplied from the reservoir tank C1. The load lock chamber C2 corresponds to the second container in the present disclosure. The temperature in the load lock chamber C2 is lower than the melting point of the target substance. The load lock chamber C2 is connected to the pressure tank C3 via the supply pipes 43, 44. A valve V2 is connected between the supply pipes 43, 44. The supply pipes 43, 44 correspond to the third and fourth paths in the present disclosure, respectively, and the valve V2 corresponds to the second valve in the present disclosure.

2.1.3 Pressure Tank C3

The pressure tank C3 contains the target substance supplied from the load lock chamber C2. The pressure tank C3 corresponds to the third container in the present disclosure. The pressure tank C3 is connected to a gas cylinder G1 via a pressurized gas pipe L0. The gas cylinder G1 contains a high-pressure rare gas such as an argon gas or a helium gas as a pressurized gas. The pressure regulator 62 is arranged at the pressurized gas pipe 0. The target supply processor 60 controls the pressure regulator 62 based on an output of a pressure gauge P, so that the pressure in the pressure tank C3 is adjusted to a predetermined pressure higher than the atmospheric pressure.

A heater 71, a nozzle 72, and a level sensor 74 are arranged at the pressure tank C3. The heater 71 is connected to a power source (not shown), and heats the inside of the pressure tank C3 to a predetermined temperature higher than the melting point of the target substance. The temperature in the pressure tank C3 is controlled by controlling the power source based on the output of a temperature sensor (not shown) arranged at the pressure tank C3. As a result, the solid target substance 27a is melted in the pressure tank C3 to generate a molten target substance.

The nozzle 72 is arranged at a lower end portion of the pressure tank C3 in the gravity direction. The tip of the nozzle 72 is opened to the inside of the chamber 2 (see FIG. 1). The molten target substance in the pressure tank C3 is output from the opening at the tip of the nozzle 72 owing to the pressure difference between the pressurized gas supplied from the pressure regulator 62 and the pressure in the chamber 2. When vibration is applied to the nozzle 72 by a piezoelectric element 73, the jet-like molten target substance output from the nozzle 72 is separated into droplets to form the target 27. The level sensor 74 detects a liquid level position of the molten target substance in the pressure tank C3.

2.2 Operation

When the level sensor 74 detects that the liquid level position of the molten target substance in the pressure tank C3 becomes below a threshold, the solid target substance 27a is supplied from the reservoir tank C1. In the comparative example, the solid target substance 27a in the reservoir tank C1 is supplied to the pressure tank C3 via the load lock chamber C2 in the following manner.

The target supply processor 60 opens the valve V1 to supply some of the solid target substances 27a contained in the reservoir tank C1 to the load lock chamber C2. At this time, in order to maintain the inside of the pressure tank C3 at a high pressure, the valve V2 is closed. The solid target substance 27a is moved from the reservoir tank C1 to the load lock chamber C2. When a desired amount of the solid target substances 27a is moved from the reservoir tank C1 to the load lock chamber C2, the target supply processor 60 closes the valve V1.

Next, the target supply processor 60 opens the valve V2 to supply the solid target substance 27a contained in the load lock chamber C2 to the pressure tank C3. The solid target substance 27a is moved from the load lock chamber C2 to the pressure tank C3. The solid target substance 27a supplied to the pressure tank C3 melts and mixes with the target substance contained and melted in the pressure tank C3. The heater 71 suppresses a decrease in the internal temperature of the pressure tank C3.

When the valve V2 is opened, a portion of the gas in the pressure tank C3 is moved to the load lock chamber C2, and the pressure in the pressure tank C3 is temporarily decreased. By closing the valve V1 before opening the valve V2, the high-pressure gas in the pressure tank C3 can be prevented from flowing from the valve V1 to the reservoir tank C1. Further, the pressurized gas in the gas cylinder G1 is supplied to the pressure tank C3 via the pressure regulator 62, thereby the pressure in the pressure tank C3 is recovered.

According to the comparative example, the solid target substance 27a contained in the reservoir tank C1 having a substantially atmospheric pressure can be supplied into the pressure tank C3 having a high pressure. Even when the target substance in the pressure tank C3 is consumed, the target substance can be replenished without replacing the pressure tank C3, so that the downtime of the EUV light generation apparatus 1 can be reduced.

2.3 Problem

Figure 3:
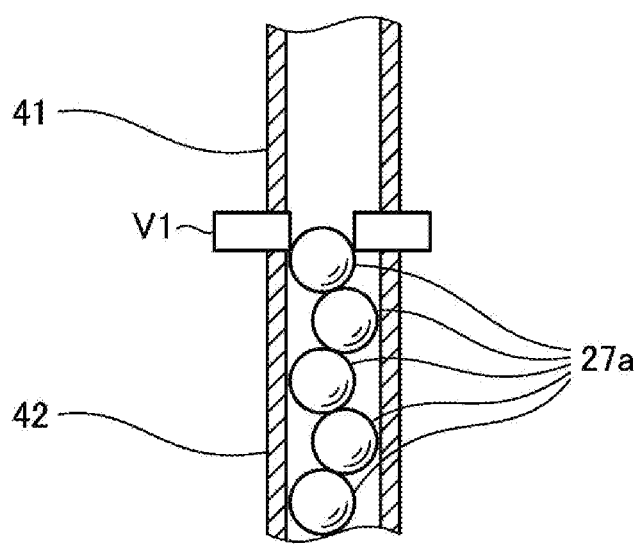
FIG. 3 schematically shows a cross-section of supply pipes and a valve arranged therebetween.

FIG. 3 schematically shows a cross-section of the supply pipes 41, 42 and the valve V1 arranged therebetween. There is a case in which clogging occurs with the solid target substance 27a in the supply pipes 41 to 44. When clogging occurs with the solid target substance 27a, the subsequent solid target substance 27a is deposited in the direction opposite to the supply direction. When the solid target substance 27a is deposited to the position of the valve V1, in some cases, the valve V1 may not be closed and the pressure in the load lock chamber C2 and the pressure tank C3 may not be controlled. In addition, there is a possibility that the valve V1 is damaged due to biting the solid target substance 27a by the valve V1.

In some embodiments described below, it is configured that the supply of the solid target substance 27a from the reservoir tank C1 to the supply pipe 41 is stopped when clogging has occurred with the solid target substance 27a.

Figure 4:
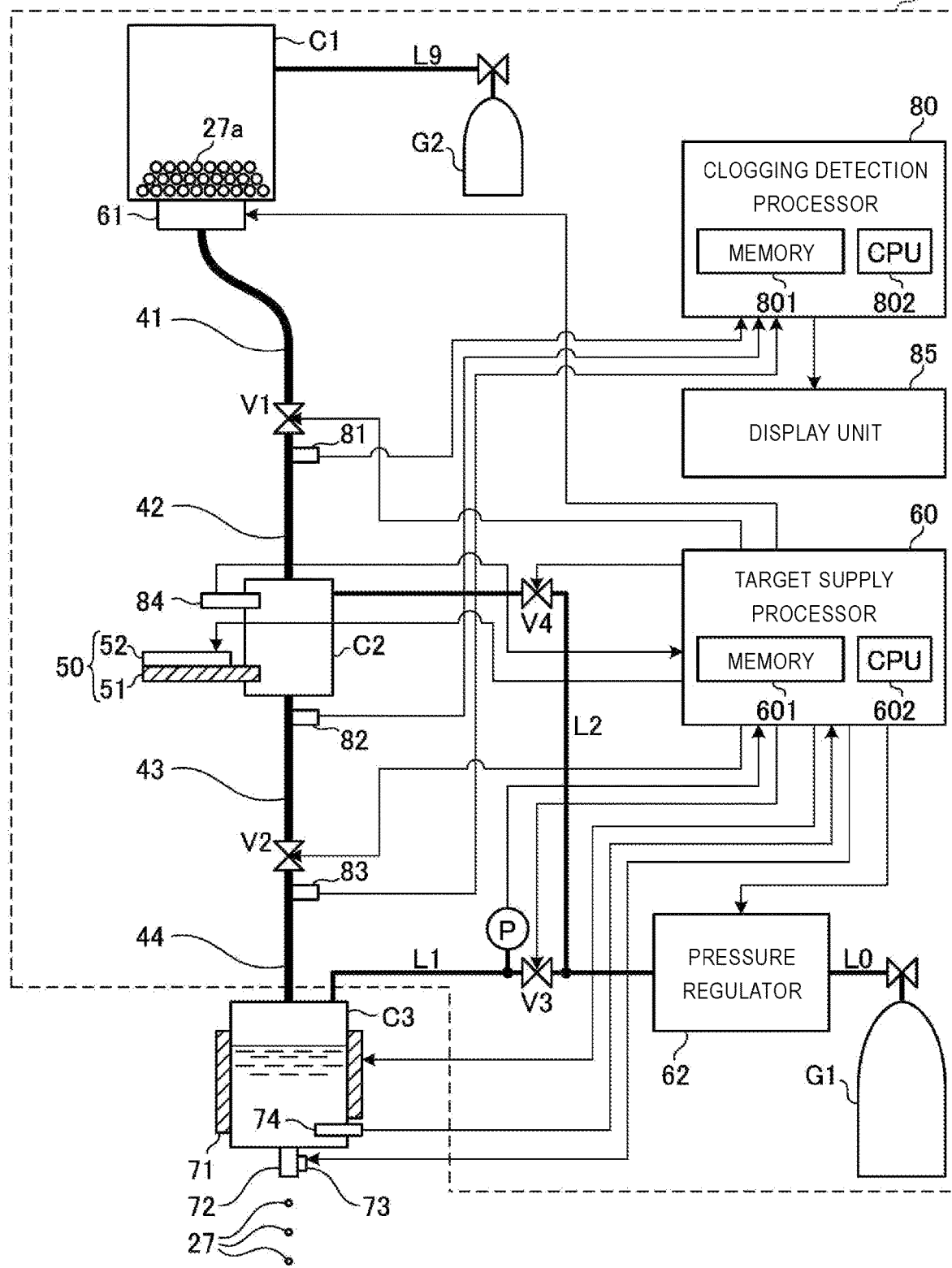
FIG. 4 schematically shows the configuration of the target supply device according to a first embodiment.

3. Target Supply Device 26 which Stops Supply of Solid Target Substance 27a when Clogging has Occurred with Solid Target Substance 27a 3.1 Configuration FIG. 4 schematically shows the configuration of the target supply device according to a first embodiment. The target supply device 26 according to the first embodiment includes a target substance replenishment device 26b. In addition to the configuration of the comparative example, the target substance replenishment device 26b includes valves V3, V4, a shutter 50, a measuring instrument 61, a clogging detection processor 80, detectors 81 to 83, a level sensor 84, and a display unit 85.

The pressurized gas pipe L0 is branched into a pipe L1 and a pipe L2.

The pipe L1 is connected to the pressure tank C3 and is configured to supply pressurized gas to the pressure tank C3. The valve V3 is arranged at the pipe L1. The pressure gauge P is arranged at the pipe L1 between the pressure tank C3 and the valve V3.

The pipe L2 is connected to the load lock chamber C2 and is configured to supply the pressurized gas to the load lock chamber C2. The valve V4 is arranged at the pipe L2.

The measuring instrument 61 is arranged at a connection portion of the lower end of the reservoir tank C1 to the supply pipe 41.

The measuring instrument 61 normally suppresses the supply of the solid target substance 27a to the supply pipe 41. This state is referred to as a first state.

The measuring instrument 61 can supply the solid target substance 27a to the supply pipe 41 while measuring the amount thereof. Measuring the amount of the solid target substances 27a includes counting the number of particles of the solid target substances 27a. The measured solid target substance 27a is moved by gravity to the load lock chamber C2 as passing through the supply pipe 41, the valve V1, and the supply pipe 42 in this order. A state in which the measuring instrument 61 allows the supply of the solid target substance 27a is referred to as a second state. The measuring instrument 61 corresponds to the first supply switching device in the present disclosure.

The purge gas contained in the gas cylinder G2 is not limited to a rare gas and may be dry air as long as it is a gas that does not easily react with the solid target substance 27a.

The detectors 81 to 83 are arranged in the supply pipes 42 to 44, respectively. The detectors 81 to 83 is configured to output detection signals indicating that clogging has occurred with the solid target substance 27a in the supply pipes 42 to 44, respectively. The detectors 81 to 83 correspond to the first to third detectors in the present disclosure, respectively, and the detection signals output from the detectors 81 to 83 correspond to the first to third detection signals in the present disclosure, respectively. Specific examples of the detectors 81 to 83 will be described later with reference to FIGS. 16 to 19.

The display unit 85 is a device that displays information in a visually recognizable manner, and may be an image display device or a light emitting element.

The clogging detection processor 80 is a processing device including a memory 801 in which a control program is stored and a CPU 802 which executes the control program. The clogging detection processor 80 corresponds to the processor in the present disclosure. The clogging detection processor 80 is specifically configured or programmed to perform various processes included in the present disclosure.

The clogging detection processor 80 determines whether or not there is clogging with the solid target substance 27a in the supply pipes 42 to 44 based on the detection signal output from each of the detectors 81 to 83. The clogging detection processor 80 specifies the place where the clogging has occurred with the solid target substance 27a, and displays the location on the display unit 85. The place where the clogging has occurred is the supply pipe 42 when the detector 81 detects the clogging, the supply pipe 43 when the detector 82 detects the clogging, and the supply pipe 44 when the detector 83 detects the clogging.

Figure 5:
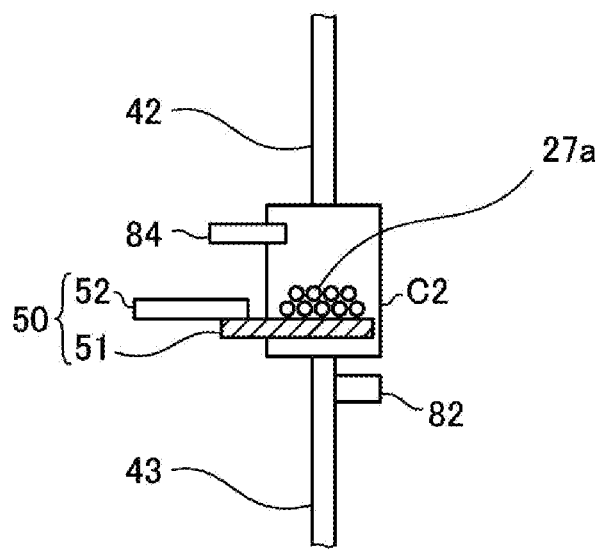
FIG. 5 schematically shows the configuration of a load lock chamber.
Figure 6:
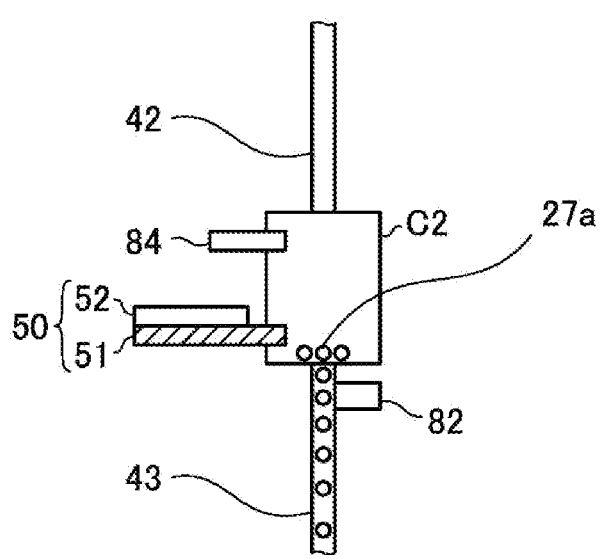
FIG. 6 schematically shows the configuration of the load lock chamber.

FIGS. 5 and 6 schematically show the configuration of the load lock chamber C2. The shutter 50 and the level sensor 84 are arranged in the load lock chamber C2.

The shutter 50 includes a receiving plate 51 and an actuator 52. The receiving plate 51 is located near the lower end of the load lock chamber C2. The actuator 52 is configured to switch the shutter 50 between a third state shown in FIG. 5 and a fourth state shown in FIG. 6 by moving the receiving plate 51.

In the third state, the receiving plate 51 is arranged to block a connecting portion between the load lock chamber C2 and the supply pipe 43. Thus, the supply of the solid target substance 27a to the supply pipe 43 is suppressed.

In the fourth state, the receiving plate 51 is arranged at a position away from the connecting portion between the load lock chamber C2 and the supply pipe 43. Thus, the supply of the solid target substance 27a to the supply pipe 43 is allowed. The solid target substance 27a is moved by gravity to the pressure tank C3 as passing through the supply pipe 43, the valve V2, and the supply pipe 44 in this order.

The shutter 50 is normally in the third state, and is temporarily set in the fourth state when the solid target substance 27a is moved to the supply pipe 43. The shutter 50 corresponds to the second supply switching device of the present disclosure.

The level sensor 84 detects whether or not the amount of the solid target substances 27a contained in the load lock chamber C2 is equal to or more than a predetermined amount.

3.2 Operation 3.2.1 Replenishment of Solid Target Substance 27a

Figure 7:
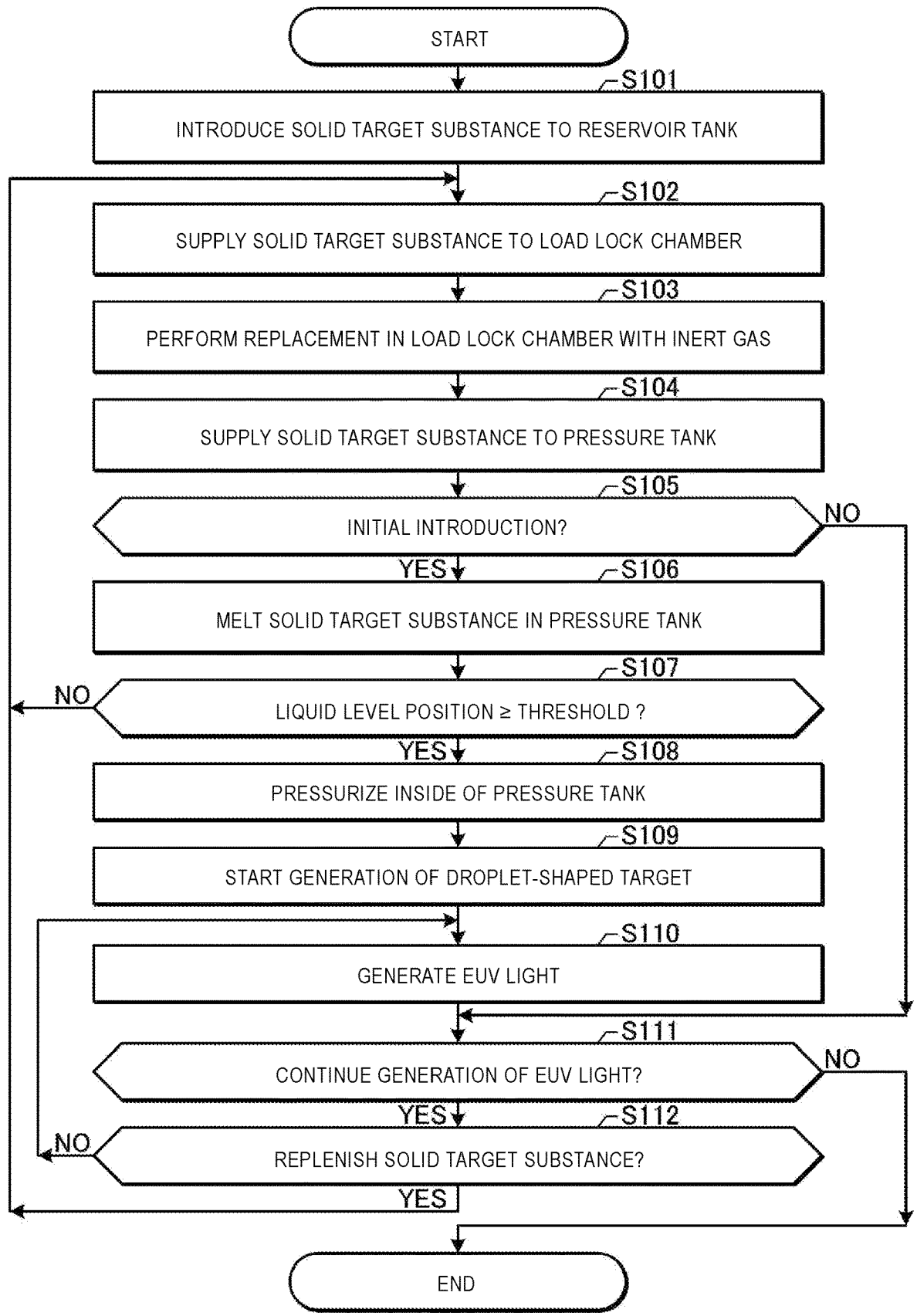
FIG. 7 is a flowchart showing the procedure for generating EUV light in the first embodiment.

FIG. 7 is a flowchart showing the procedure for generating EUV light in the first embodiment. The procedure for generating EUV light shown in FIG. 7 includes the procedure for replenishing the solid target substance 27a. The processing shown in FIG. 7 is mainly executed by the target supply processor 60 (see FIG. 4), but may partially be executed by the processor 5 (see FIG. 1).

In S101, the target supply processor 60 introduces the solid target substance 27a to the reservoir tank C1 using an introduction device (not shown). At this time, the target supply processor 60 sets the measuring instrument 61 to the first state, sets the shutter 50 to the third state, and sets the valves V1 to V4 to a closed state. When the solid target substance 27a is introduced to the reservoir tank C1, purge gas is supplied from the gas cylinder G2 to the reservoir tank C1.

In S102, the target supply processor 60 opens the valve V1 and sets the measuring instrument 61 to the second state, thereby supplying the solid target substance 27a to the load lock chamber C2. The operation of S102 may be repeated in accordance with the amount of the solid target substances 27a in the load lock chamber C2 detected by the level sensor 84.

In S103, the target supply processor 60 closes the valve V1 and opens the valve V4 to perform replacement in the load lock chamber C2 with rare gas being inert gas. By alternately performing the exhaust of the inside of the load lock chamber C2 by an exhaust device (not shown) and the introduction of the rare gas through the valve V4 a plurality of times, the oxygen partial pressure in the load lock chamber C2 may be reduced.

In S104, the target supply processor 60 closes the valve V4, opens the valve V2, and sets the shutter 50 to the fourth state, thereby supplying the solid target substance 27a to the pressure tank C3. Then, the target supply processor 60 sets the shutter 50 to the third state and closes the valve V2.

In S105, the target supply processor 60 determines whether or not the introduction of the solid target substance 27a to the pressure tank C3 is the initial introduction. When the molten target substance is already contained in the pressure tank C3 and the target 27 is output from the nozzle 72, it is determined not to be the initial introduction (S105: NO), and the target supply processor 60 advances processing to S111. It is determined to be the initial introduction when the target 27 is not output from the nozzle 72 (S105: YES), the target supply processor 60 advances processing to S106.

In S106, the target supply processor 60 controls the power source of the heater 71 to melt the solid target substance 27a in the pressure tank C3.

In S107, the target supply processor 60 determines whether or not the liquid level position of the molten target substance in the pressure tank C3 output from the level sensor 74 is at or above the threshold. When the liquid level position of the molten target substance is below the threshold (S107: NO), the target supply processor 60 returns processing to S102. When the liquid level position of the molten target substance is at or above the threshold (S107: YES), the target supply processor 60 advances processing to S108.

In S108, the target supply processor 60 opens the valve V3 and controls the pressure regulator 62 to pressurize the inside of the pressure tank C3. When the inside of the pressure tank C3 is pressurized, the molten target substance is output from the nozzle 72 in a jet form.

In S109, the target supply processor 60 controls a driver (not shown) of the piezoelectric element 73 to apply vibration to the nozzle 72, thereby starting generation of the droplet-shaped target 27.

In S110, the processor 5 controls the laser device 3 to irradiate the target 27 with pulse laser light, thereby generating EUV light.

In S111, the processor 5 determines whether or not to continue the generation of the EUV light. When the generation of the EUV light is to be continued (S111: YES), the processor 5 advances processing to S112. When the generation of the EUV light is not to be continued (S111: NO), the processor 5 ends processing of the present flowchart.

In S112, the target supply processor 60 determines whether or not to replenish the solid target substance 27a. For example, when the liquid level position output from the level sensor 74 is below the threshold, it is determined to replenish the solid target substance 27a (S112: YES), and the processor 5 returns processing to S102. When the liquid level position is at or above the threshold, it is determined not to replenish the solid target substance 27a (S112: NO), and the processor 5 returns processing to S110.

The replenishment of the solid target substance 27a and the generation of EUV light are performed as described above.

3.2.2 Detection of Clogging with Solid Target Substance 27a

Figure 8:
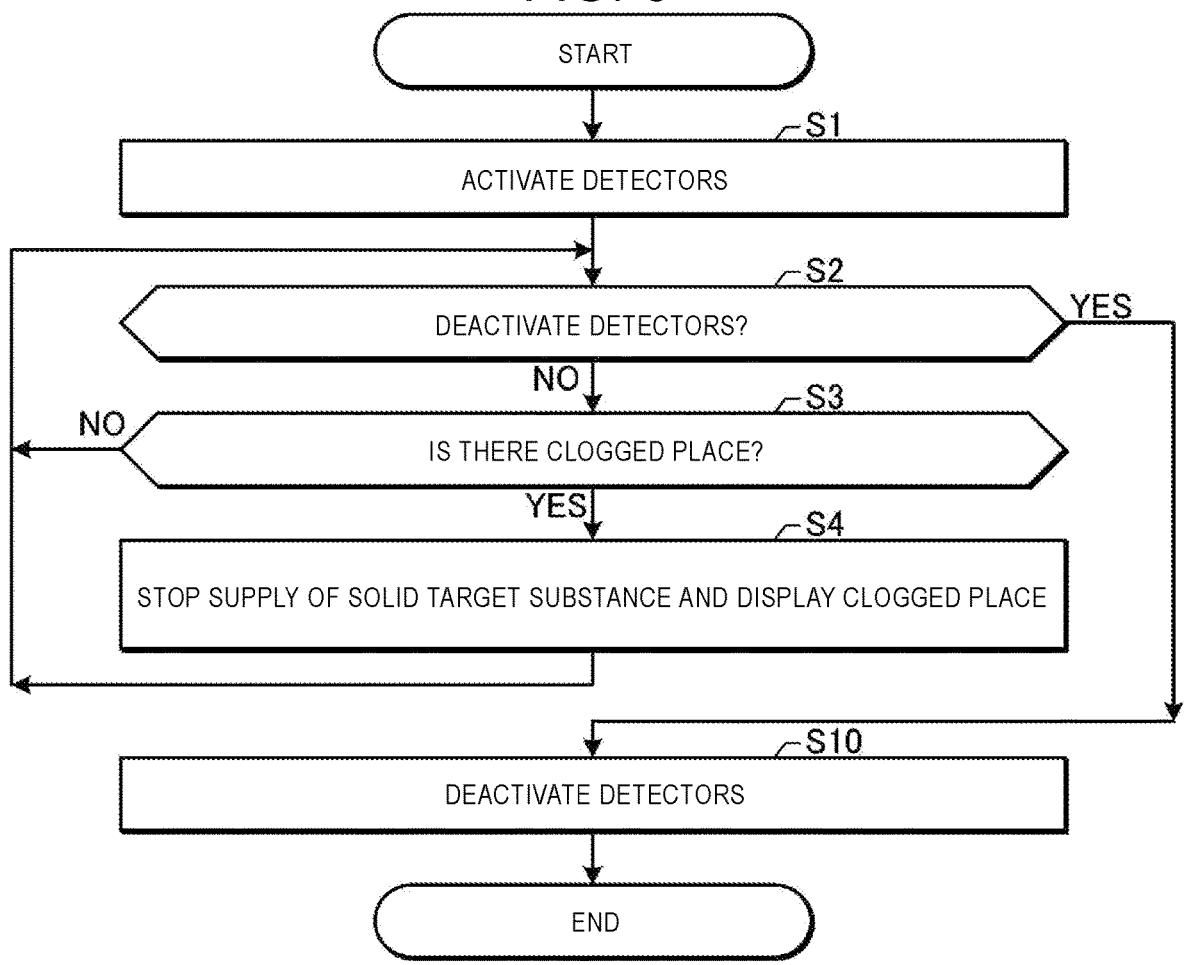
FIG. 8 is a flowchart showing the procedure for detecting clogging with a solid target substance in the first embodiment.

FIG. 8 is a flowchart showing the procedure for detecting clogging with the solid target substance 27a in the first embodiment. The processing shown in FIG. 8 is performed by the clogging detection processor 80 (see FIG. 4).

In S1, the clogging detection processor 80 activates the detectors 81 to 83.

In S2, the clogging detection processor 80 determines whether or not to deactivate the detectors 81 to 83. When the detectors 81 to 83 are to be deactivated (S2: YES), the clogging detection processor 80 advances processing to S10. When the detectors 81 to 83 is not to be deactivated (S2: NO), the clogging detection processor 80 advances processing to S3. The activation and deactivation of the detectors 81 to 83 are performed based on a signal from the processor 5.

In S3, the clogging detection processor 80 determines whether or not there is a clogged place. When at least one of the detectors 81 to 83 detects clogging, the clogging detection processor 80 determines that there is a clogged place (S3: YES) and advances processing to S4. When none of the detectors 81 to 83 detects clogging, the clogging detection processor 80 determines that there is no clogged place (S3: NO) and returns the processing to S2.

In S4, the clogging detection processor 80 sends a signal to the target supply processor 60 requesting that the supply of the solid target substance 27a be stopped. The supply of the solid target substance 27a is stopped as follows.

(1) When the detector 81 detects clogging, the measuring instrument 61 is set to the first state to stop the supply of the solid target substance 27a to the supply pipe 41. This can prevent biting when the valve V1 is operated. Before the valve V1 is operated, it is possible to wait until the clogging of the supply pipe 42 is eliminated and confirm that clogging is no longer detected by the detector 81.

(2) When the detector 82 detects clogging, the measuring instrument 61 is set to the first state to stop the supply of the solid target substance 27a to the supply pipe 41. This can prevent biting when the shutter 50 is operated. Before the shutter 50 is operated, it is possible to wait until the clogging of the supply pipe 43 is eliminated and confirm that clogging is no longer detected by the detector 82.

(3) When the detector 83 detects clogging, the measuring instrument 61 is set to the first state to stop the supply of the solid target substance 27a to the supply pipe 41. This can prevent biting when the valve V2 is operated. Before the valve V2 is operated, it is possible to wait until the clogging of the supply pipe 44 is eliminated and confirm that clogging is no longer detected by the detector 83.

The clogging detection processor 80 further specifies the location where the clogging has occurred and causes the display unit 85 to display the place as maintenance information. By specifying and displaying the place where the clogging has occurred, it is possible to efficiently perform recovery work by the operator. The recovery work by the operator includes tapping a part of the supply pipe 42 to 44 where the clogging has occurred, or replacing components.

When it takes a long time to eliminate the clogging, the clogging detection processor 80 may suppress output of the target 27 from the nozzle 72 by exhausting some of the gas inside the pressure tank C3 using an exhaust device (not shown) connected to the pressure tank C3. When all the molten target substance in the pressure tank C3 is output as the target 27, the inside of the nozzle 72 is not filled with the molten target substance, and oxide of the target substance may adhere in the nozzle 72. By suppressing the output of the target 27, the nozzle 72 can be suppressed from being blocked.

After S4, the clogging detection processor 80 returns processing to S2.

In S10, the clogging detection processor 80 deactivates the detectors 81 to 83 and ends the processing of the present flowchart.

3.3 Modification

Figure 9:
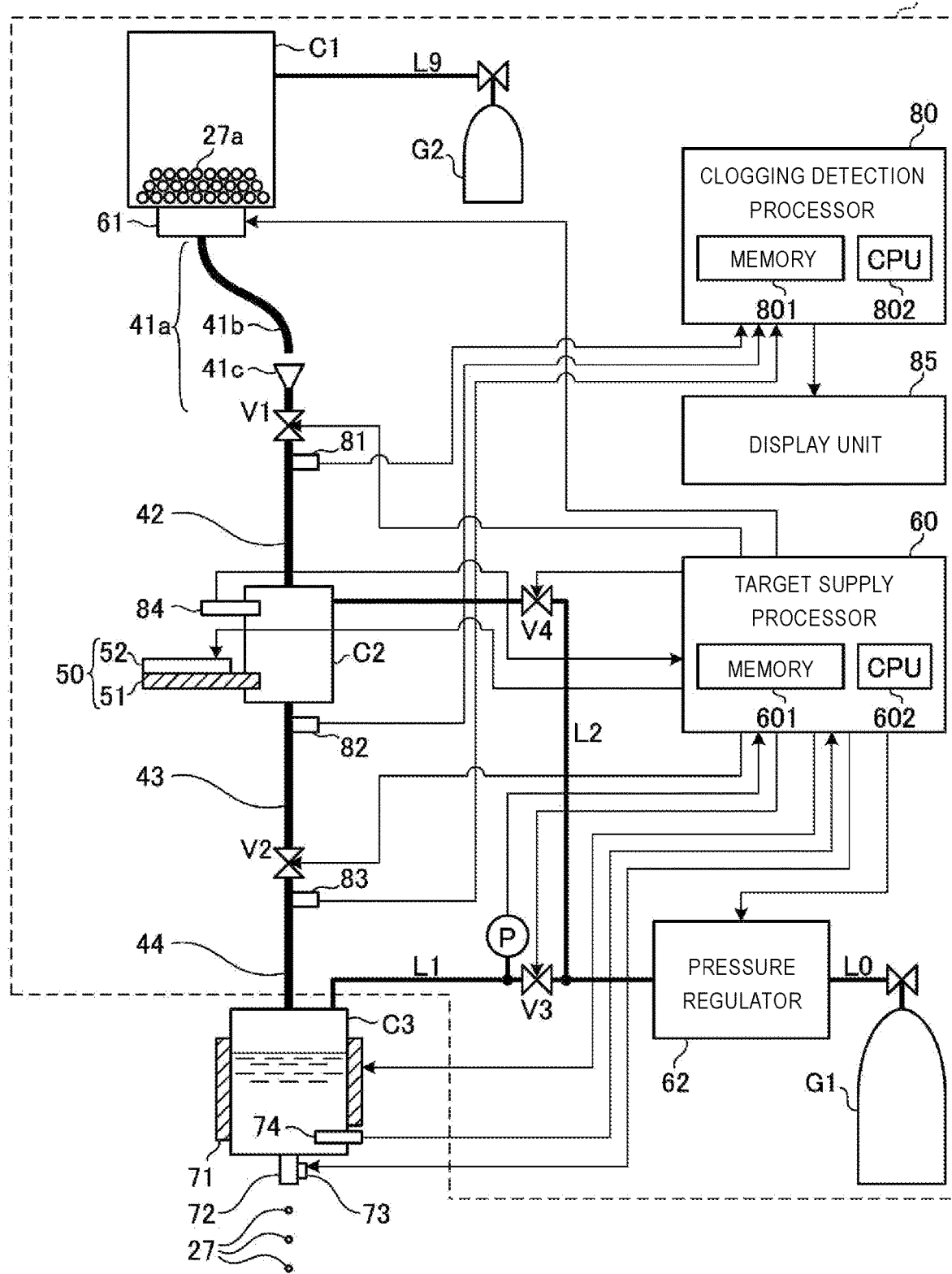
FIG. 9 schematically shows the configuration of the target supply device according to a modification of the first embodiment.

FIG. 9 schematically shows the configuration of the target supply device 26 according to a modification of the first embodiment. The target supply device 26 according to the modification includes a target substance replenishment device 26c. The path of the solid target substance 27a between the reservoir tank C1 and the valve V1 is not limited to the supply pipe 41 (see FIG. 4), but may be a path 41a in which all or some thereof is exposed to the outside. For example, the path 41a may include a flexible pipe 41b and a funnel 41c spaced apart from each other, and may be configured such that the solid target substance 27a freely falls from the lower end of the flexible pipe 41b to the funnel 41c.

3.4 Effect

According to the first embodiment, the target supply processor 60 controls the measuring instrument 61 to the first state based on the detection signal output from the detector 81. This can prevent biting when the valve V1 is operated.

According to the first embodiment, the target supply processor 60 controls the measuring instrument 61 to the first state based on the detection signal output from the detector 82. This can prevent biting when the shutter 50 is operated.

According to the first embodiment, the target supply processor 60 controls the measuring instrument 61 to the first state based on the detection signal output from the detector 83. This can prevent biting when the valve V2 is operated.

According to the first embodiment, the clogging detection processor 80 specifies the supply pipe clogged with the solid target substance 27a among the supply pipes 42 to 44 based on the detection signal output from any of the detectors 81 to 83. The clogging detection processor 80 outputs a signal to the display unit 85 to display the specified result. Thus, it is possible to efficiently perform the recovery work by the operator or the like.

According to the first embodiment, the target supply processor 60 suppresses the output of the target 27 from the nozzle 72 by exhausting some of the gas in the pressure tank C3 based on the detection signal output by any of the detectors 81 to 83. Accordingly, it is possible to suppress clogging of the nozzle 72 due to the oxide of the target substance adhering to the inside of the nozzle 72.

In other respects, the first embodiment is similar to the comparative example.

Figure 10:
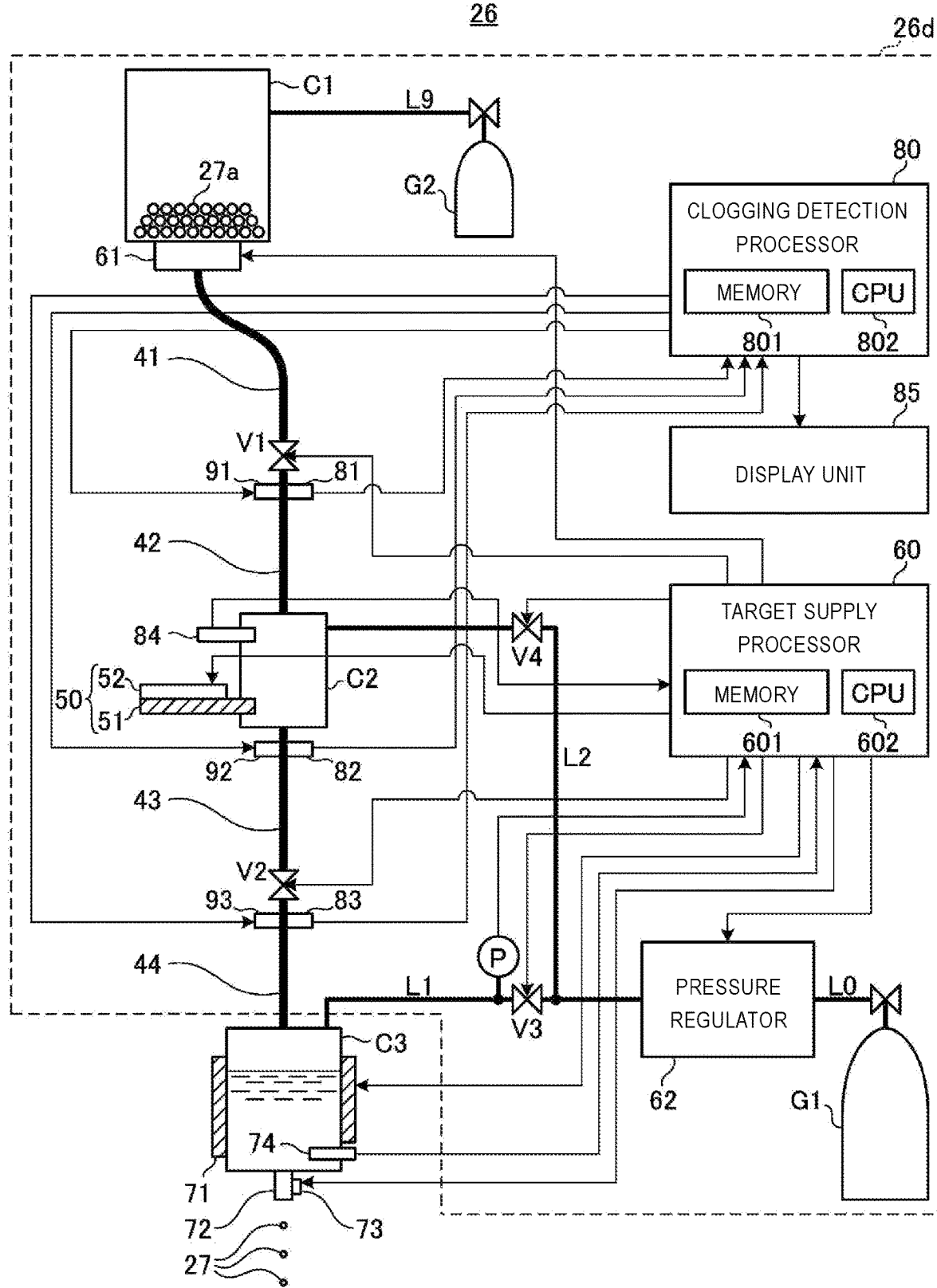
FIG. 10 schematically shows the configuration of a target supply device according to a second embodiment.

4. Target Supply Device 26 which Activates Vibration Devices 91 to 93 when Clogging has Occurred with Solid Target Substance 27a 4.1 Configuration FIG. 10 schematically shows the configuration of a target supply device 26 according to a second embodiment. The target supply device 26 according to the second embodiment includes a target substance replenishment device 26d. In addition to the configuration of the first embodiment, the target substance replenishment device 26d includes vibration devices 91 to 93. The vibration devices 91 to 93 are provided in the supply pipes 42 to 44, respectively. The vibration devices 91 to 93 may be arranged at positions facing the detectors 81 to 83 with the supply pipes 42 to 44 interposed therebetween, respectively. Each of the vibration devices 91 to 93 includes a vibration unit (not shown) such as a piezoelectric element and a driver (not shown). The vibration devices 91 to 93 correspond to the first to third vibration devices in the present disclosure, respectively.

Figure 11:
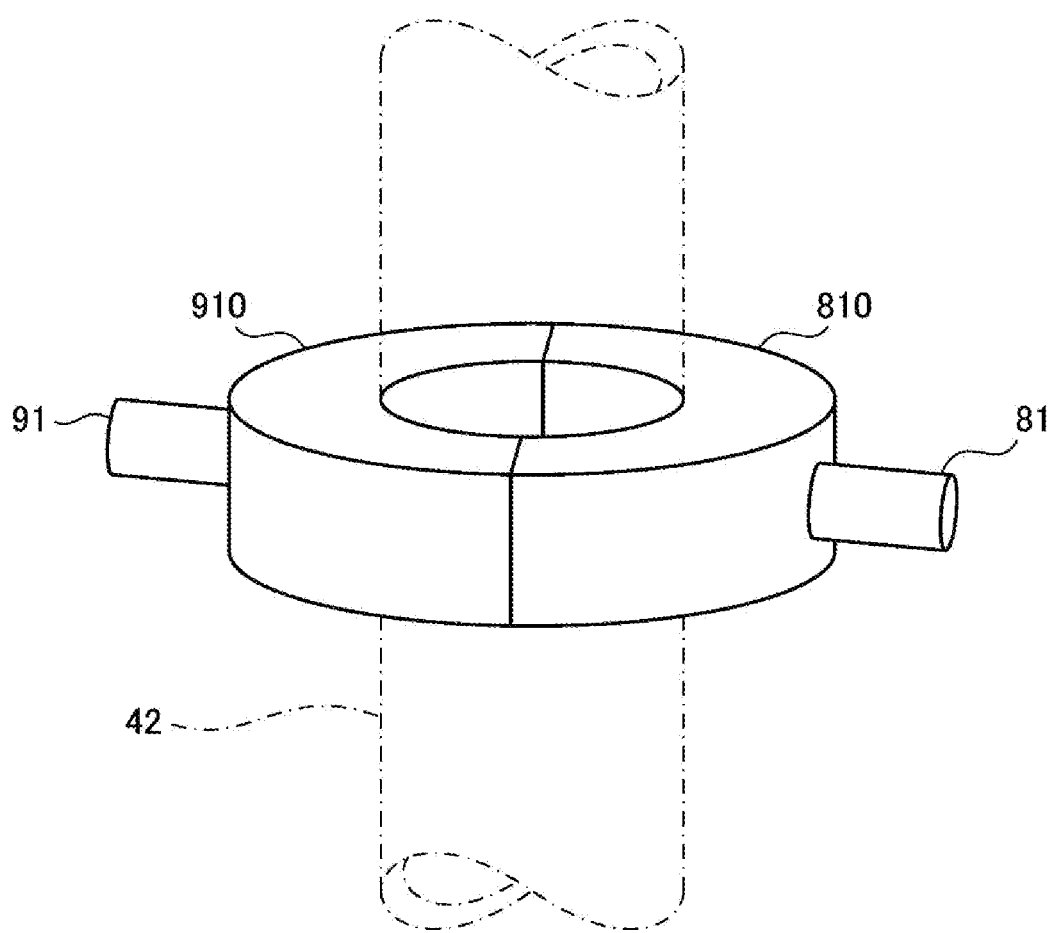
FIG. 11 shows an example of a detector and a vibration device arranged in the supply pipe.

FIG. 11 shows an example of the detector 81 and the vibration device 91 arranged in the supply pipe 42. The detector 81 and the vibration device 91 are attached to a base portion 810 and a base portion 910, respectively. The base portion 810 and the base portion 910 each have a shape of a half circular ring. The base portion 810 and the base portion 910 are arranged and fixed to each other at positions facing each other with the supply pipe 42 interposed therebetween, thereby the detector 81 and the vibration device 91 are fixed to the supply pipe 42.

4.2 Detection of Clogging with Solid Target Substance 27a

Figure 12:
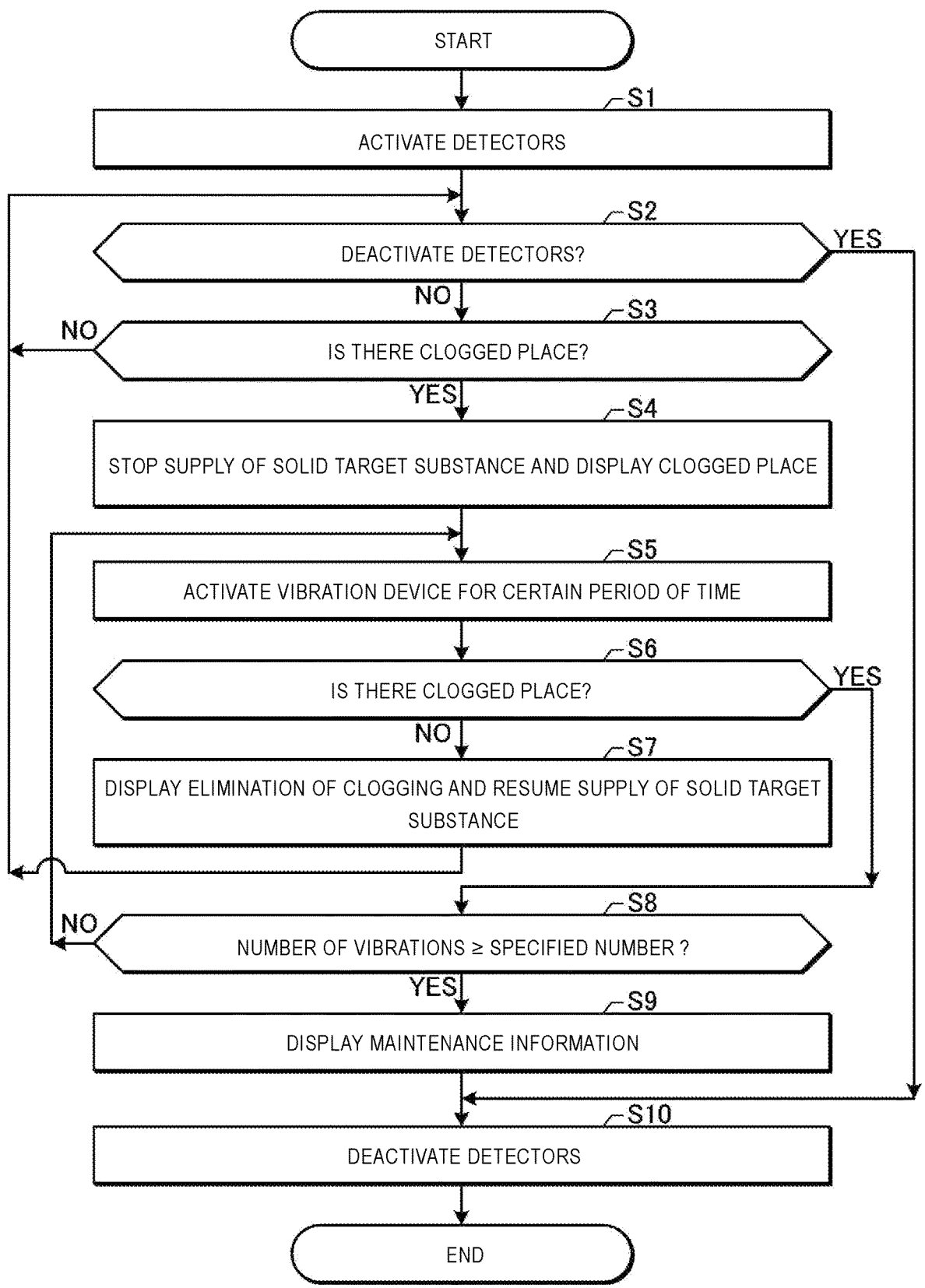
FIG. 12 is a flowchart showing the procedure for detecting clogging with a solid target substance in the second embodiment.

FIG. 12 is a flowchart showing the procedure for detecting clogging with the solid target substance 27a in the second embodiment. The processing shown in FIG. 12 is performed by the clogging detection processor 80.

The processes from S1 to S4 are the same as those described with reference to FIG. 8. In the second embodiment, after S4, the clogging detection processor 80 advances processing to S5.

In S5, the clogging detection processor 80 activates the vibration devices 91 to 93 for a certain period of time. The vibration device 91 may be operated when the detector 81 detects clogging, the vibration device 92 may be activated when the detector 82 detects clogging, and the vibration device 93 may be activated when the detector 83 detects clogging. Alternatively, when any one of the detectors 81 to 83 detects clogging, all the vibration devices 91 to 93 may be activated.

When any of the vibration devices 91 to 93 are activated, the processor 5 may stop the irradiation with the pulse laser light by the laser device 3. When the nozzle 72 vibrates due to operation of any of the vibration devices 91 to 93, it may be difficult to stably generate the target 27. By stopping the irradiation with the pulse laser light, the generation of EUV light is stopped, and quality degradation of EUV light can be suppressed.

In S6, the clogging detection processor 80 determines whether or not there is a clogging place. This process is similar to S3. When at least one of the detectors 81 to 83 detects clogging, the clogging detection processor 80 determines that there is a clogged place (S6: YES) and advances processing to S8. When none of the detectors 81 to 83 detects clogging, the clogging detection processor 80 determines that there is no clogged place (S6: NO) and advances processing to S7.

In S7, the clogging detection processor 80 causes the display unit 85 to display information indicating elimination of the clogging and resumes the supply of the solid target substance 27a using the measuring instrument 61. After S7, the clogging detection processor 80 returns processing to S2.

In S8, the clogging detection processor 80 determines whether or not the number of vibrations is equal to or larger than a specified number of times. When the number of vibrations is smaller than the specified number of times (S8: NO), the clogging detection processor 80 returns processing to S5 because there is a possibility that the clogging can be eliminated by further vibration. When the number of vibrations is equal to or larger than the specified number of times (S8: YES), the clogging detection processor 80 advances processing to S9.

In S9, the clogging detection processor 80 causes the display unit 85 to display maintenance information. After S9, the clogging detection processor 80 advances processing to S10.

The process of S10 is the same as that described with reference to FIG. 8.

4.3 Effect

According to the second embodiment, the target substance replenishment device 26d includes the vibration device 91 which vibrates the supply pipe 42, and the clogging detection processor 80 activates the vibration device 91 based on the detection signal output from the detector 81. This makes it possible to automatically eliminate the clogging of the supply pipe 42 without performing recovery work by the operator.

According to the second embodiment, the detector 81 and the vibration device 91 are arranged to face each other with the supply pipe 42 interposed therebetween. Since the detector 81 and the vibration device 91 are arranged at positions close to each other, it is possible to perform mounting thereof to the supply pipe 42 with a small amount of work, and electrical wiring for the detector 81 and the vibration device 91 can also be arranged collectively. The above similarly applies to the arrangement of the detector 82 and the vibration device 92 and the arrangement of the detector 83 and the vibration device 93.

According to the second embodiment, the target substance replenishment device 26d includes the vibration device 92 which vibrates the supply pipe 43, and the clogging detection processor 80 activates the vibration device 92 based on the detection signal output from the detector 82. Thus, the clogging of the supply pipe 43 can be automatically eliminated.

According to the second embodiment, the target substance replenishment device 26d includes the vibration device 93 which vibrates the supply pipe 44, and the clogging detection processor 80 activates the vibration device 93 based on the detection signal output from the detector 83. Thus, the clogging of the supply pipe 44 can be automatically eliminated.

According to the second embodiment, when the clogging detection processor 80 activates any of the vibration devices 91 to 93 based on the detection signal output from any of the detectors 81 to 83, the processor 5 causes the laser device 3 to stop the irradiation with the pulse laser light. Accordingly, the generation of the EUV light can be stopped, and the quality degradation of the EUV light can be suppressed.

In other respects, the second embodiment is similar to the first embodiment.

5. Target Supply Device 26 Including Joints F1, F2, M1, M2 for Removing Valve V1

5.1 Configuration

Figure 13:
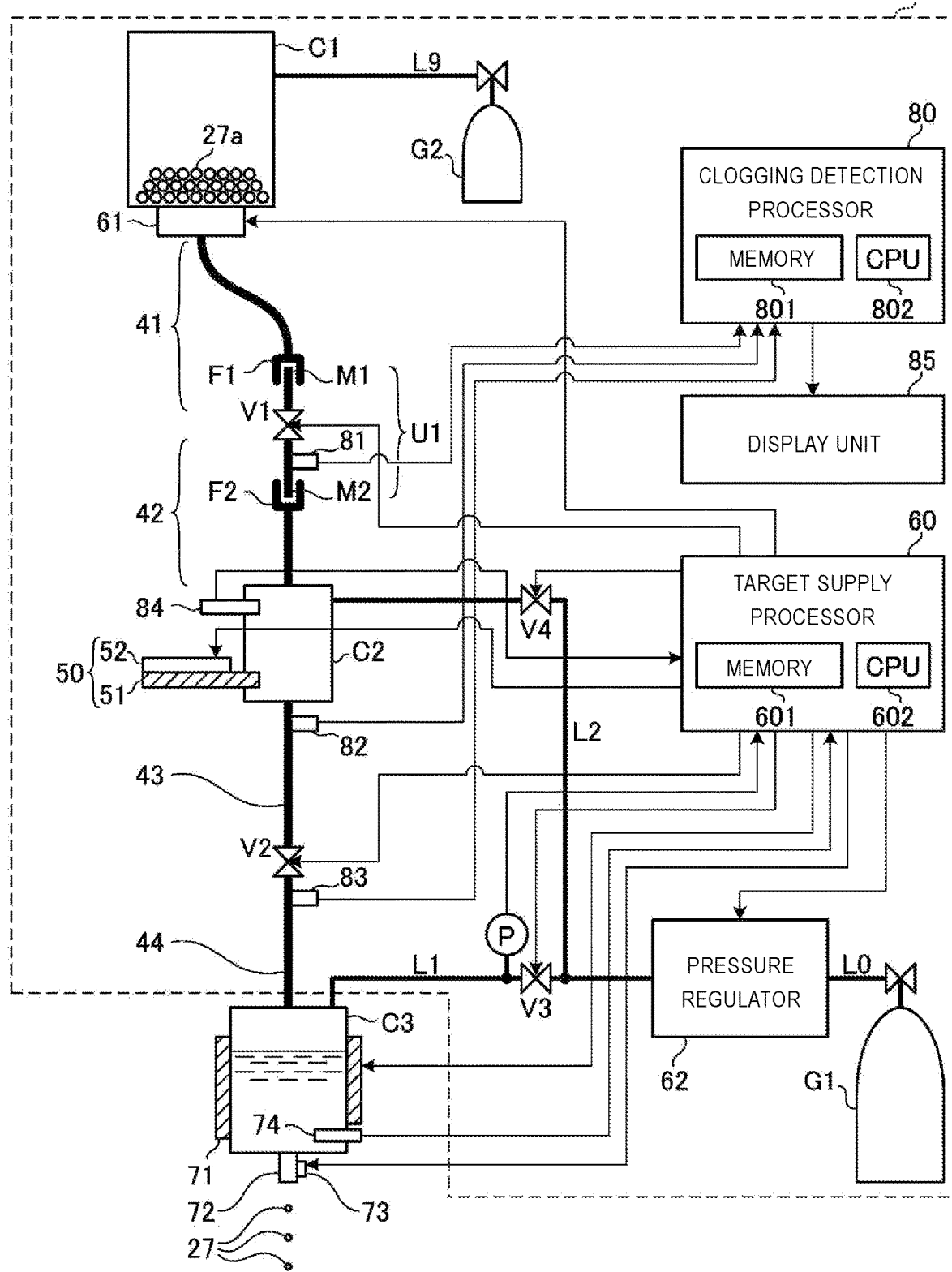
FIG. 13 schematically shows the configuration of the target supply device according to a third embodiment.

FIG. 13 schematically shows the configuration of the target supply device 26 according to the third embodiment. The target supply device 26 according to the third embodiment includes a target substance replenishment device 26e. In addition to the configuration of the first embodiment, the target substance replenishment device 26e includes joints F1, F2, M1, M2.

The joints F1, F2 are female and the joints M1, M2 are male. The joints F1, M1 which are paired are arranged in the middle of the supply pipe 41, and the joints F2, M2 which are paired are arranged in the middle of the supply pipe 42. Thus, the valve V1 is configured to be detachable. The joints F1, M1 correspond to the first joint in the present disclosure, and the joints F2, M2 correspond to the second joint in the present disclosure.

When clogging has occurred in the supply pipe 42, there is a high possibility that the cause of the clogging exists in the supply pipe 42. Accordingly, it is desirable that not only the valve V1 but also a portion of the supply pipe 42 be removable. Therefore, the joints F2, M2 may be arranged in the supply pipe 42 between the detector 81 and the load lock chamber C2. In this case, it is possible to remove the detector 81, the valve V1, and the joints M1, M2 as an integral unit U1.

5.2 Operation

When the detector 81 detects clogging in S3 in FIG. 8 and replacement of components is required as recovery work by the operator, the unit U1 can be removed to be replaced.

5.3 Effect

According to the third embodiment, the target substance replenishment device 26e includes the pair of joints F1, M1 located in the supply pipe 41 between the measuring instrument 61 and the valve V1, and the pair of joints F2, M2 located in the supply pipe 42 between the detector 81 and the load lock chamber C2. Since the valve V1 and the detector 81 located between the joints F1, M1 and the joints F2, M2 are integrally detachable, the maintenance work can be efficiently performed.

In other respects, the third embodiment is similar to the first embodiment. Alternatively, the joints F1, F2, M1, M2 may be arranged in the second embodiment.

6. Target Supply Device 26 Including Joints F3 to F6 and M3 to M6 for Removing Load Lock Chamber C2 and Valve V2

6.1 Configuration

Figure 14:
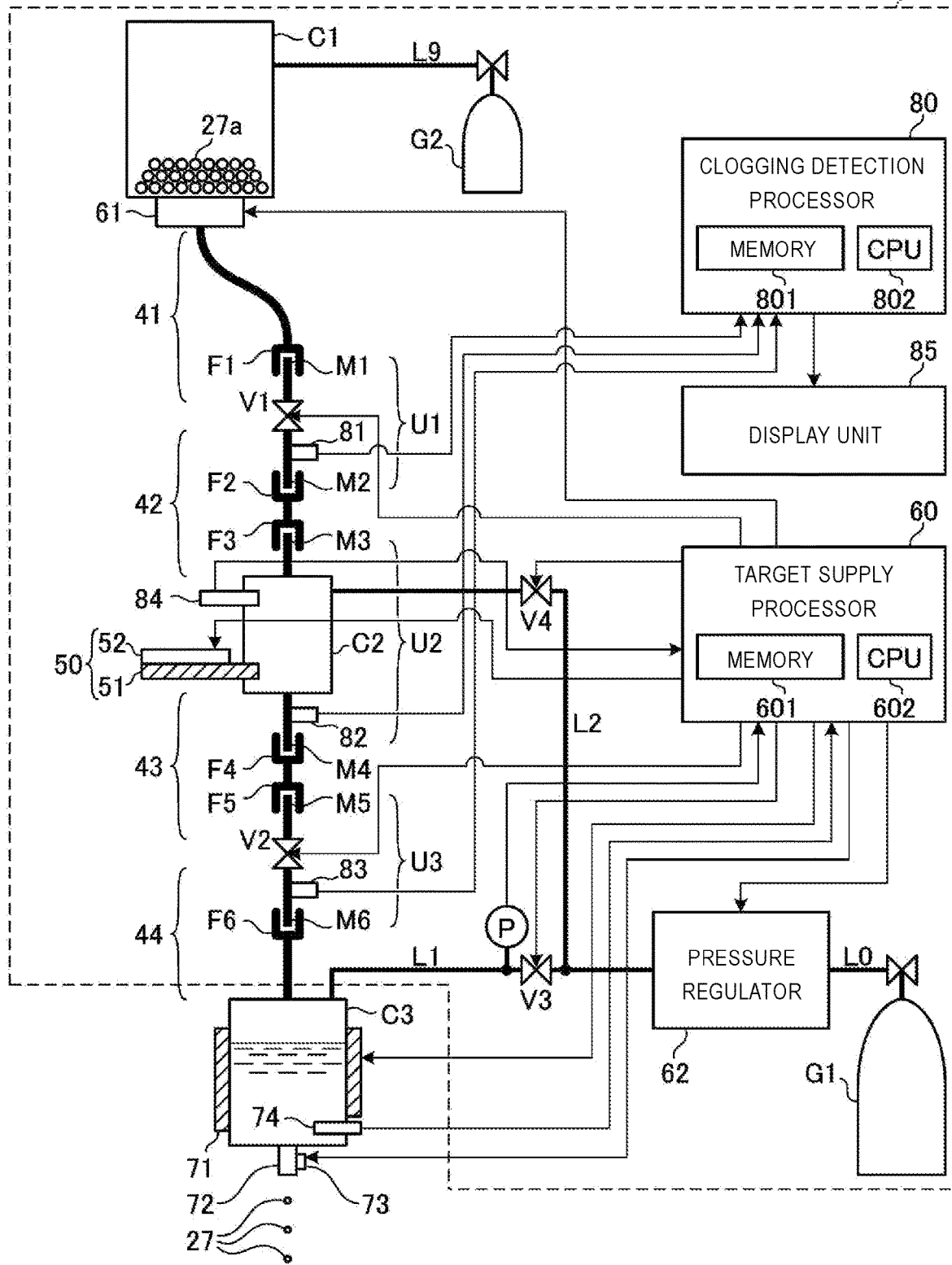
FIG. 14 schematically shows the configuration of the target supply device according to a fourth embodiment.

FIG. 14 schematically shows the configuration of the target supply device 26 according to a fourth embodiment. The target supply device 26 according to the fourth embodiment includes a target substance replenishment device 26f. The target substance replenishment device 26f includes joints F3 to F6 and M3 to M6 in addition to the configuration of the third embodiment.

The joints F3 to F6 are female and the joints M3 to M6 are male.

The joints F3, M3 which are paired are arranged in the supply pipe 42 between the joint F2 and the load lock chamber C2, and the joints F4, M4 which are paired are arranged in the middle of the supply pipe 43. Thus, the load lock chamber C2 is configured to be detachable. The joints F3, M3 correspond to the third joint in the present disclosure, and the joints F4, M4 correspond to the fourth joint in the present disclosure.

The joints F4, M4 may be arranged in the supply pipe 43 between the detector 82 and the valve V2. In this case, the detector 82, the load lock chamber C2, and the joints M3, M4 can be removed as an integrated unit U2.

The joints F5, M5 which are paired are arranged in the supply pipe 43 between the joint F4 and the valve V2, and the joints F6, M6 which are paired are arranged in the middle of the supply pipe 44. Thus, the valve V2 is configured to be detachable. The joints F5, M5 correspond to the fifth joint in the present disclosure, and the joints F6, M6 correspond to the sixth joint in the present disclosure.

The joints F6, M6 may be arranged in the supply pipe 44 between the detector 83 and the pressure tank C3. In this case, it is possible to remove the detector 83, the valve V2, and the joints M5, M6 as an integral unit U3.

6.2 Operation

When the detector 82 detects clogging in S3 in FIG. 8 and replacement of components is required as recovery work by the operator, the unit U2 can be removed to be replaced. When the detector 83 detects clogging and replacement of components is required as recovery work by the operator, the unit U3 can be removed to be replaced.

6.3 Effect

According to the fourth embodiment, the target substance replenishment device 26f includes the pair of joints F3, M3 located in the supply pipe 42 between the joint F2 and the load lock chamber C2, and the pair of joints F4, M4 located in the supply pipe 43 between the detector 82 and the valve V2. Since the load lock chamber C2 and the detector 82 located between the joints F3, M3 and the joints F4, M4 are integrally detachable, the maintenance work can be efficiently performed.

According to the fourth embodiment, the target substance replenishment device 26f includes the pair of joints F5, M5 located in the supply pipe 43 between the joint F4 and the valve V2, and the pair of joints F6, M6 located in the supply pipe 44 downstream the detector 83. Since the valve V2 and the detector 83 located between the joints F5, M5 and the joints F6, M6 are integrally detachable, the maintenance work can be efficiently performed.

In other respects, the fourth embodiment is similar to the third embodiment.

7. Target Supply Device 26 Including Joints F1 to F6 and M1 to M6 and Vibration Devices 91 to 93

7.1 Configuration

Figure 15:
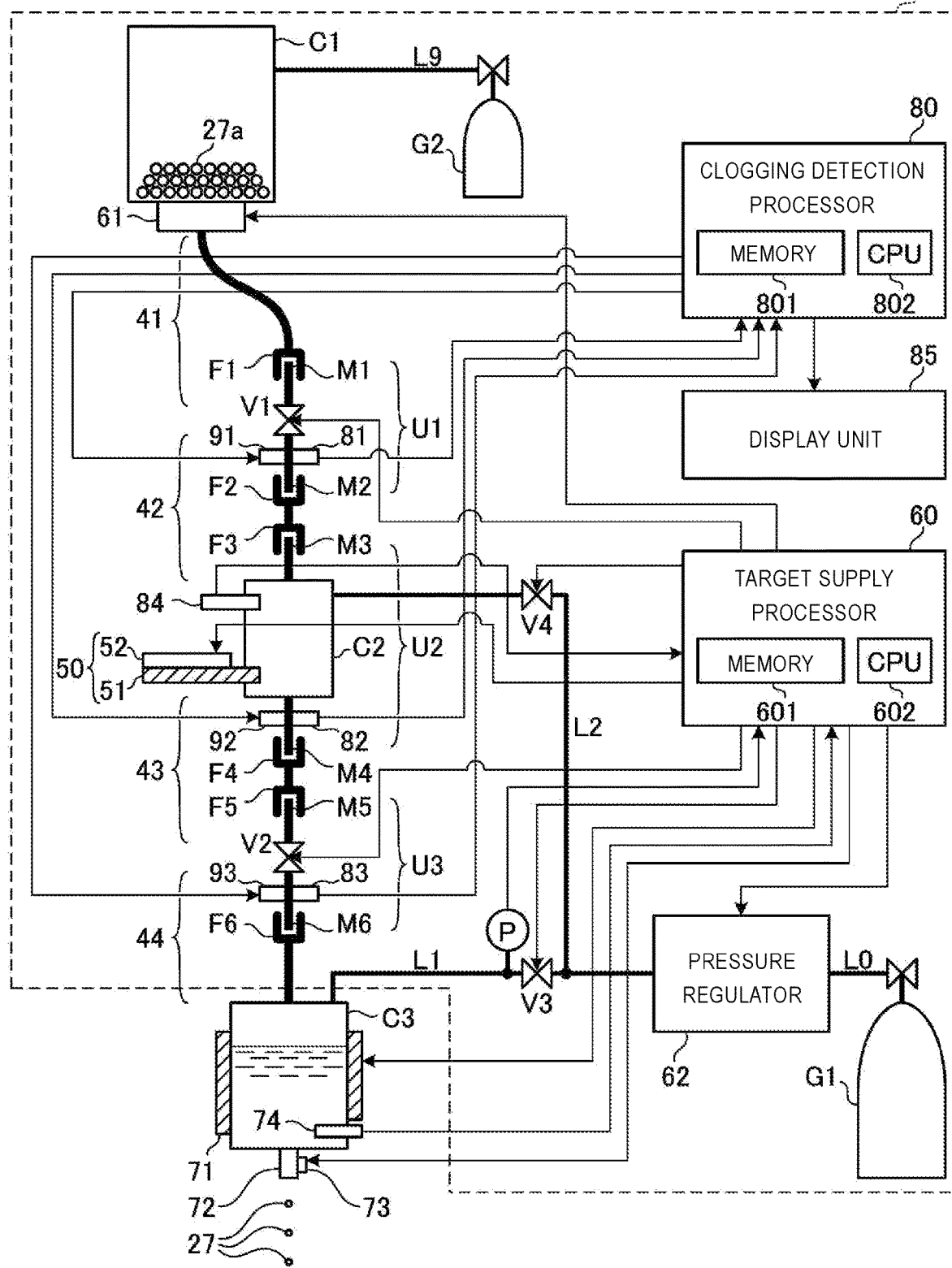
FIG. 15 schematically shows the configuration of the target supply device according to a fifth embodiment.

FIG. 15 schematically shows the configuration of the target supply device 26 according to a fifth embodiment. The target supply device 26 according to the fifth embodiment includes a target substance replenishment device 26g. The target substance replenishment device 26g includes joints F1 to F6 and M1 to M6 in addition to the configuration of the second embodiment.

The configuration and operation of the joints F1 to F6 and M1 to M6 may be similar to those described with reference to FIG. 14. In the fifth embodiment, the vibration devices 91 to 93 are arranged at positions facing the detectors 81 to 83, respectively.

7.2 Operation

Since the vibration devices 91 to 93 are arranged at positions facing the detectors 81 to 83, respectively, the units U1 to U3 include the vibration devices 91 to 93, respectively, and are integrally detachable for each unit.

In other respects, the fifth embodiment is similar to the second embodiment.

8. Configuration Example of Detector 81

Hereinafter, detectors 81a, 81b, 81d, 81i will be described as configuration examples of the detector 81. The solid target substance 27a is metal, and the supply pipes 42, 44 may also be metal. In order to detect the solid target substance 27a in the supply pipe 42, the detectors 81a, 81b, 81d, 81i are configured as follows.

8.1 Eddy Current Detector 81a 8.1.1 Configuration

Figure 16:
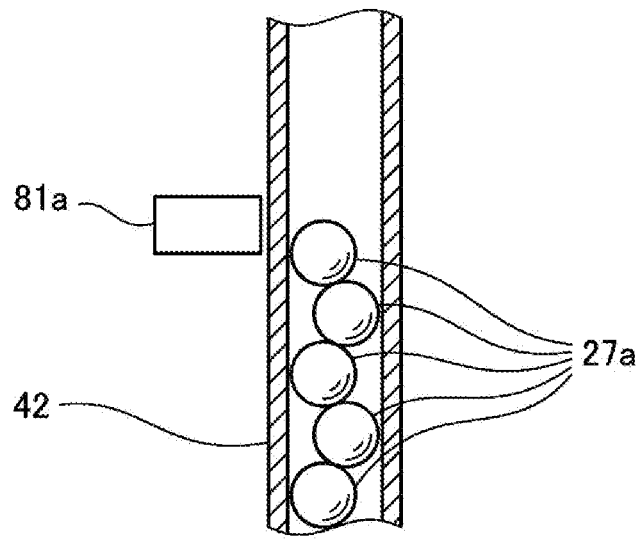
FIG. 16 schematically shows the configuration of the detector in a sixth embodiment.

FIG. 16 schematically shows the configuration of the detector 81a in a sixth embodiment. The detector 81a is an eddy current type.

The detector 81a generates a pulse-like first magnetic field from the outside of the supply pipe 42 toward the supply pipe 42. An eddy current is generated at the supply pipe 42 or the inside thereof by the first magnetic field. Eddy currents generated differ depending on whether or not the solid target substance 27a is present in the supply pipe 42. The detector 81a detects the eddy current to determine whether or not the supply pipe 42 is clogged at the inside thereof with the solid target substance 27a. Detection of the eddy current is performed by detecting a second magnetic field generated by the eddy current.

8.1.2 Effect

According to the sixth embodiment, the detector 81a is located outside the supply pipe 42, generates an eddy current at the supply pipe 42 and the inside thereof, and detects the eddy current. Accordingly, the detector 81a capable of detecting the solid target substance 27a in the supply pipe 42 can be attached without forming a hole in the supply pipe 42.

In other respects, the sixth embodiment is similar to the first to fifth embodiments.

8.2 Capacitive Detector 81b 8.2.1 Configuration

Figure 17:
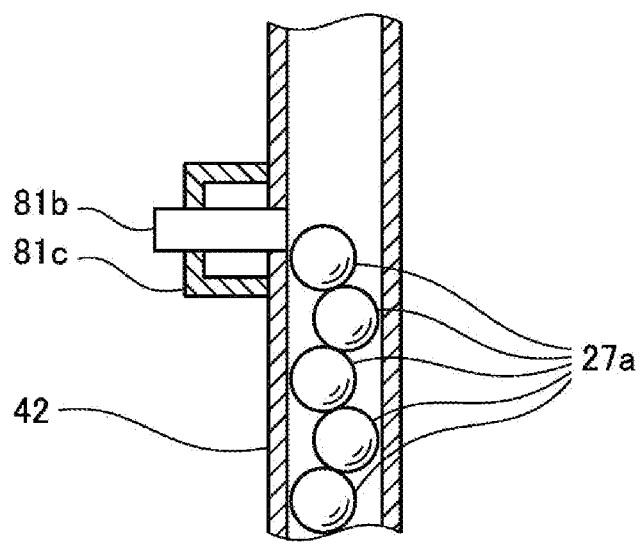
FIG. 17 schematically shows the configuration of the detector in a seventh embodiment.

FIG. 17 schematically shows the configuration of the detector 81b in a seventh embodiment. The detector 81b is a capacitive type.

The detector 81b is inserted to a hole formed in the supply pipe 42, and one end of the detector 81b is exposed to the inside of the supply pipe 42. The detector 81b is fixed to the supply pipe 42 by a fixing portion 81c. The detector 81b detects whether or not the inside of the supply pipe 42 is clogged with the solid target substance 27a by detecting electrostatic capacity between the detector 81b and an object in the supply pipe 42.

8.2.2 Effect

According to the seventh embodiment, the detector 81b detects the capacitance between the detector 81b and the solid target substance 27a in the supply pipe 42 through the hole formed at the supply pipe 42. Thus, it is possible to detect whether or not clogging has occurred with the solid target substance 27a in the supply pipe 42. In other respects, the seventh embodiment is similar to the first to fifth embodiments.

8.3 Optical Detector 81d 8.3.1 Configuration

Figure 18:
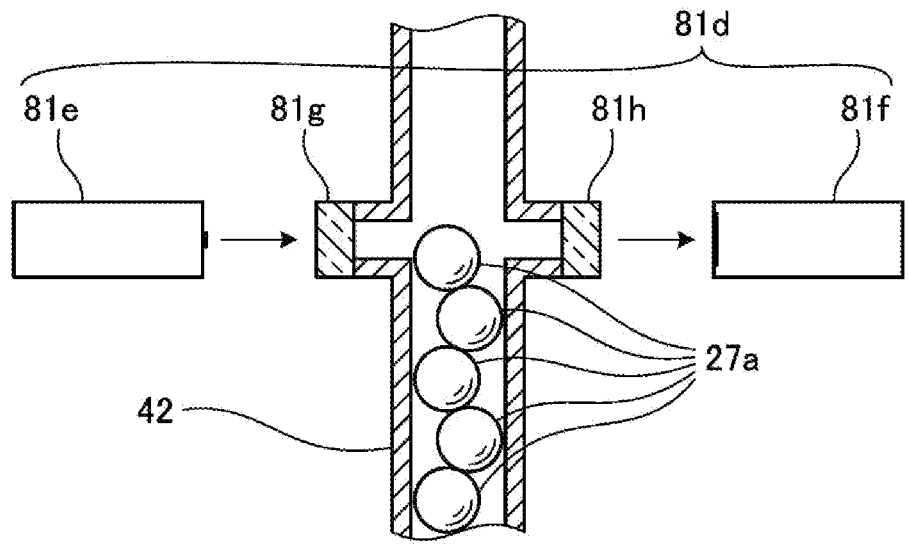
FIG. 18 schematically shows the configuration of the detector according to an eighth embodiment.

FIG. 18 schematically shows the configuration of the detector 81d according to an eighth embodiment. The detector 81d is an optical type and includes a light source 81e, an optical sensor 81f, and windows 81g, 81h.

The light source 81e and the optical sensor 81f are arranged at positions being outside the supply pipe 42 and facing each other with the supply pipe 42 interposed therebetween. The windows 81g, 81h are formed on opposing wall surfaces of the supply pipe 42 between the light source 81e and the optical sensor 81f. The windows 81g, 81h correspond to the first and second windows in the present disclosure, respectively.

The detection light generated from the light source 81e and incident on the optical sensor 81f through the windows 81g, 81h has different light amounts depending on whether or not the inside of the supply pipe 42 is clogged with the solid target substance 27a. The detector 81d can detect whether or not the inside of the supply pipe 42 is clogged with the solid target substance 27a based on the light amount of the detection light detected by the optical sensor 81f.

8.3.2 Effect

According to the eighth embodiment, the detector 81d includes the windows 81g, 81h respectively arranged on the opposing wall surfaces of the supply pipe 42, the light source 81e which causes detection light to enter the inside of the supply pipe 42 through the window 81g, and the optical sensor 81f which detects light emitted to the outside of the supply pipe 42 through the window 81h. Thus, it is possible to detect whether or not clogging has occurred with the solid target substance 27a in the supply pipe 42.

In other respects, the eighth embodiment is similar to the first to fifth embodiments.

8.4 Detector 81i Including Optical Fibers 81j, 81k 8.4.1 Configuration

Figure 19:
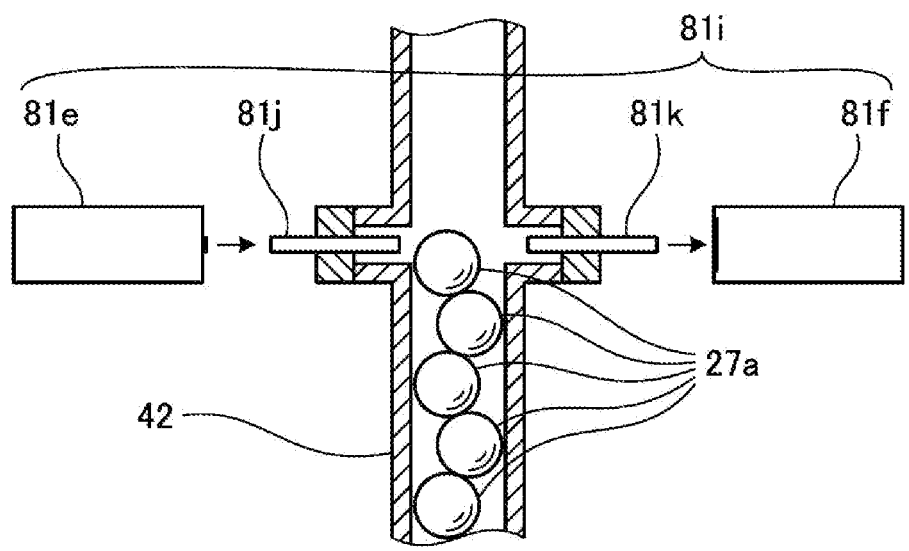
FIG. 19 schematically shows the configuration of the detector in a ninth embodiment.

FIG. 19 schematically shows the configuration of the detector 81i in a ninth embodiment. The detector 81i is an optical type and includes a light source 81e, an optical sensor 81f, and optical fibers 81j, 81k.

The light source 81e and the optical sensor 81f are arranged at positions being outside the supply pipe 42 and facing each other with the supply pipe 42 interposed therebetween. The optical fibers 81j, 81k penetrate, respectively, the wall surface facing the supply pipe 42 between the light source 81e and the optical sensor 81f, with one end of each thereof being exposed to the outside of the supply pipe 42 and the other end of each thereof being exposed to the inside of the supply pipe 42. The optical fibers 81j, 81k correspond to the first and second optical fibers in the present disclosure, respectively.

The detection light generated from the light source 81e and incident on the optical sensor 81f through the optical fibers 81k, 81f has different light amounts depending on whether or not the inside of the supply pipe 42 is clogged with the solid target substance 27a. The detector 81i can detect whether or not the inside of the supply pipe 42 is clogged with the solid target substance 27a based on the light amount of the detection light detected by the optical sensor 81f.

8.4.2 Effect

According to the ninth embodiment, the detector 81i includes the optical fibers 81j, 81k each penetrating the wall surface facing the supply pipe 42, the light source 81e causing detection light to enter the inside of the supply pipe 42 through the optical fiber 81j, and the optical sensor 81f detecting light emitted to the outside of the supply pipe 42 through the optical fiber 81k. Thus, it is possible to detect whether or not clogging has occurred with the solid target substance 27a in the supply pipe 42. In other respects, the ninth embodiment is similar to the first to fifth embodiments.

9. Others

Figure 20:
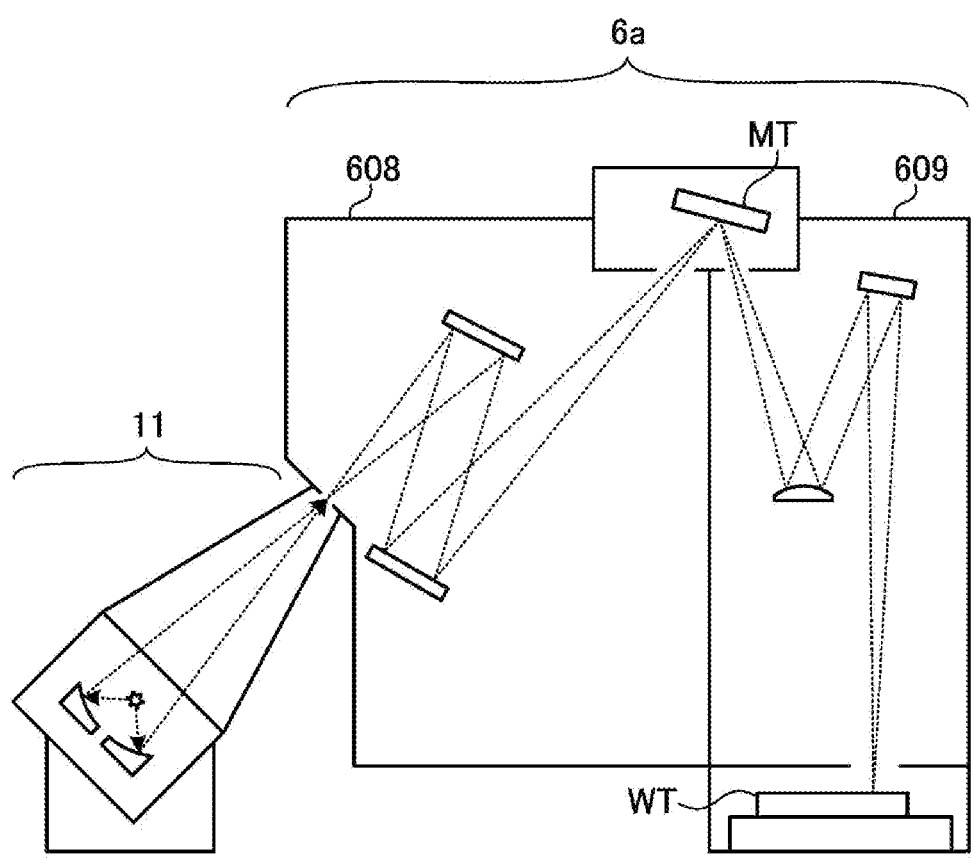
FIG. 20 schematically shows the configuration of an exposure apparatus connected to an EUV light generation system.

FIG. 20 schematically shows the configuration of an exposure apparatus 6a connected to the EUV light generation system 11.

In FIG. 20, the exposure apparatus 6a as the EUV light utilization apparatus 6 (see FIG. 1) includes a mask irradiation unit 608 and a workpiece irradiation unit 609. The mask irradiation unit 608 illuminates, via a reflection optical system, a mask pattern of a mask table MT with the EUV light incident from the EUV light generation system 11. The workpiece irradiation unit 609 images the EUV light reflected by the mask table MT onto a workpiece (not shown) arranged on a workpiece table WT via a reflection optical system. The workpiece is a photosensitive substrate such as a semiconductor wafer on which photoresist is applied. The exposure apparatus 6a synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured.

Figure 21:
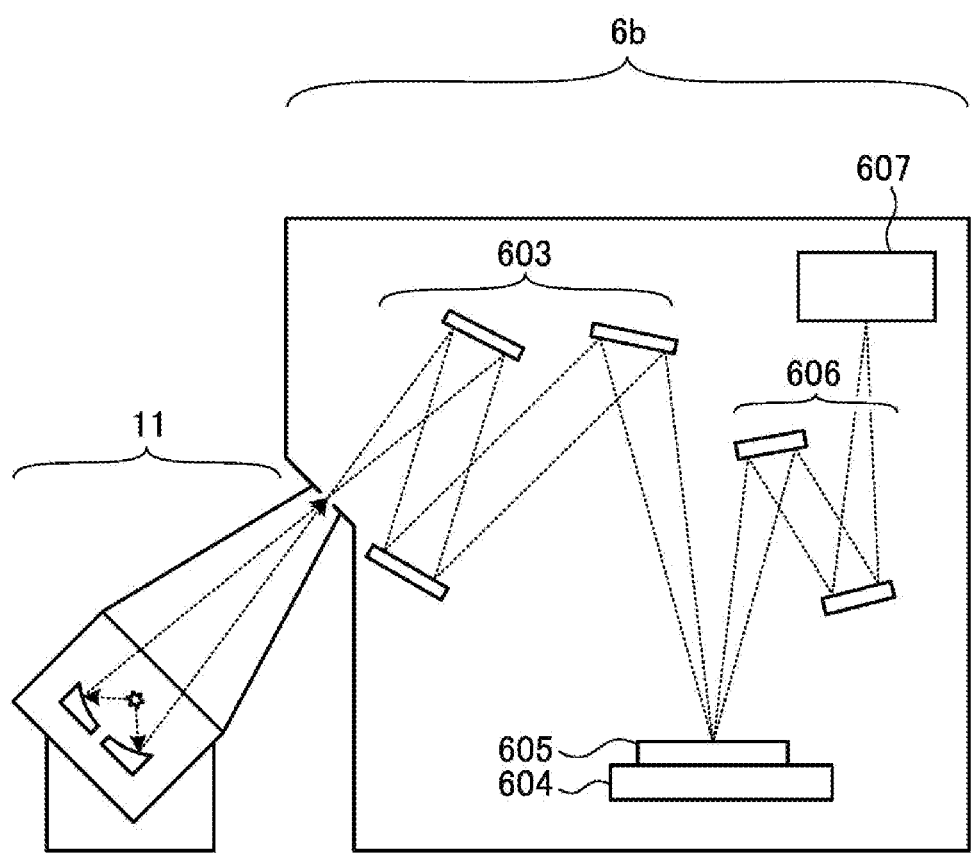
FIG. 21 schematically shows the configuration of an inspection apparatus connected to the EUV light generation system.

FIG. 21 schematically shows the configuration of an inspection apparatus 6b connected to the EUV light generation system 11.

In FIG. 21, the inspection apparatus 6b as the EUV light utilization apparatus 6 (see FIG. 1) includes an illumination optical system 603 and a detection optical system 606. The illumination optical system 603 reflects the EUV light incident from the EUV light generation system 11 to illuminate a mask 605 placed on a mask stage 604. Here, the mask 605 conceptually includes a mask blank before a pattern is formed. The detection optical system 606 reflects the EUV light from the illuminated mask 605 and forms an image on a light receiving surface of a detector 607. The detector 607 having received the EUV light obtains the image of the mask 605. The detector 607 is, for example, a time delay integration (TDI) camera. A defect of the mask 605 is inspected based on the image of the mask 605 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 6a.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A target substance replenishment device for use in an extreme ultraviolet light generation apparatus which outputs extreme ultraviolet light by irradiating a target substance with pulse laser light to turn the target substance into plasma, the target substance replenishment device comprising:
    a first container configured to contain a solid target substance;
    a first path through which the solid target substance supplied from the first container passes;
    a first supply switching device capable of switching between a first state in which supply of the solid target substance from the first container to the first path is suppressed and a second state in which the supply of the solid target substance from the first container to the first path is allowed;
    a first valve connected to the first path;
    a second path which is connected to the first valve and through which the solid target substance having passed through the first valve passes;
    a first detector configured to output a first detection signal indicating that the second path is clogged with the solid target substance; and
    a processor configured to control the first supply switching device to the first state based on the first detection signal.

2. The target substance replenishment device according to claim 1, further comprising a first vibration device configured to vibrate the second path,
    wherein the processor activates the first vibration device based on the first detection signal.

3. The target substance replenishment device according to claim 1, further comprising a first vibration device configured to vibrate the second path,
    wherein the first detector and the first vibration device are arranged to face each other with the second path interposed therebetween.

4. The target substance replenishment device according to claim 1, further comprising:

a second container connected to the second path and configured to contain the solid target substance having passed through the second path;

a third path which is connected to the second container and through which the solid target substance supplied from the second container passes;

a second supply switching device capable of switching between a third state in which supply of the solid target substance from the second container to the third path is suppressed and a fourth state in which the supply of the solid target substance from the second container to the third path is allowed; and a second detector configured to output a second detection signal indicating that the third path is clogged with the solid target substance, wherein the processor controls the first supply switching device to the first state based on the second detection signal.

5. The target substance replenishment device according to claim 4, further comprising a second vibration device configured to vibrate the third path, wherein the processor activates the second vibration device based on the second detection signal.

6. The target substance replenishment device according to claim 4, further comprising:

a second valve connected to the third path;

a fourth path which is connected to the second valve and through which the solid target substance having passed through the second valve passes; and a third detector configured to output a third detection signal indicating that the fourth path is clogged with the solid target substance, wherein the processor controls the first supply switching device to the first state based on the third detection signal.

7. The target substance replenishment device according to claim 6, wherein the processor specifies a path clogged with the solid target substance among the second to fourth paths based on the first to third detection signals, and outputs a signal indicating a specified result.

8. The target substance replenishment device according to claim 6, further comprising a third vibration device configured to vibrate the fourth path, wherein the processor activates the third vibration device based on the third detection signal.

9. The target substance replenishment device according to claim 6, further comprising:

a pair of first joints located in the first path between the first supply switching device and the first valve; and a pair of second joints located in the second path between the first detector and the second container, wherein the first valve and the first detector located between the first and second joints are configured to be integrally detachable.

10. The target substance replenishment device according to claim 9, further comprising:

a pair of third joints located in the second path between the second container and the second joints; and a pair of fourth joints located in the third path between the second detector and the second valve, wherein the second container and the second detector located between the third and fourth joints are configured to be integrally detachable.

11. The target substance replenishment device according to claim 10, further comprising:

a pair of fifth joints located in the third path between the second valve and the fourth joints; and a pair of sixth joints located in the fourth path downstream the third detector, wherein the second valve and the third detector located between the fifth and sixth joints are configured to be integrally detachable.

12. The target substance replenishment device according to claim 1, wherein the second path includes a metal pipe, the solid target substance is metal, and the first detector is located outside the metal pipe and is configured to generate an eddy current at the metal pipe and inside thereof and detect the eddy current.

13. The target substance replenishment device according to claim 1, wherein the second path includes a metal pipe, and the first detector is configured to detect electrostatic capacity between the first detector and the solid target substance in the metal pipe through a hole formed at the metal pipe.

14. The target substance replenishment device according to claim 1, wherein the second path includes a metal pipe, and the first detector includes first and second windows arranged on opposing wall surfaces of the metal pipe, respectively, a light source configured to cause detection light to enter inside of the metal pipe through the first window, and an optical sensor configured to detect light emitted to outside of the metal pipe through the second window.

15. The target substance replenishment device according to claim 1, wherein the second path includes a metal pipe, and the first detector includes first and second optical fibers each penetrating a wall surface facing the metal pipe, a light source configured to cause detection light to enter inside of the metal pipe through the first optical fiber, and a light sensor configured to detect light emitted to outside of the metal pipe through the second optical fiber.

16. An extreme ultraviolet light generation apparatus, comprising:

the target substance replenishment device according to claim 1, a third container configured to melt the solid target substance replenished by the target substance replenishment device to produce a molten target substance;

a nozzle configured to output the molten target substance;

a laser device configured to irradiate, with pulse laser light, the molten target substance reaching a predetermined region after being output from the nozzle; and an EUV light concentrating mirror configured to concentrate extreme ultraviolet light emitted from plasma generated in the predetermined region.

17. The extreme ultraviolet light generation apparatus according to claim 16, wherein the processor suppresses output of the molten target substance from the nozzle by causing some of gas in the third container to be exhausted based on the first detection signal.

18. The extreme ultraviolet light generation apparatus according to claim 16, further comprising a first vibration device configured to vibrate the second path, wherein the processor activates the first vibration device based on the first detection signal and causes the laser device to stop irradiation with pulse laser light.

19. An electronic device manufacturing method, comprising:
- generating extreme ultraviolet light using an extreme ultraviolet light generation apparatus;
- emitting the extreme ultraviolet light to an exposure apparatus; and
- exposing a photosensitive substrate to the extreme ultraviolet light in the exposure apparatus to manufacture an electronic device,
- the extreme ultraviolet light generation apparatus including:
- a target substance replenishment device;
- a third container configured to melt a solid target substance replenished by the target substance replenishment device to produce a molten target substance;
- a nozzle configured to output the molten target substance;
- a laser device configured to irradiate, with pulse laser light, the molten target substance reaching a predetermined region after being output from the nozzle; and
- an EUV light concentrating mirror configured to concentrate extreme ultraviolet light emitted from plasma generated in the predetermined region, and
- the target substance replenishment device including:
- a first container configured to contain the solid target substance;
- a first path through which the solid target substance supplied from the first container passes;
- a first supply switching device capable of switching between a first state in which supply of the solid target substance from the first container to the first path is suppressed and a second state in which the supply of the solid target substance from the first container to the first path is allowed;
- a first valve connected to the first path;
- a second path which is connected to the first valve and through which the solid target substance having passed through the first valve passes;
- a first detector configured to output a first detection signal indicating that the second path is clogged with the solid target substance; and
- a processor configured to control the first supply switching device to the first state based on the first detection signal.

20. An electronic device manufacturing method, comprising:
- inspecting a defect of a mask by irradiating a mask with extreme ultraviolet light generated by an extreme ultraviolet light generation apparatus;
- selecting a mask using a result of the inspection; and
- exposing and transferring a pattern formed on the selected mask onto a photosensitive substrate,
- the extreme ultraviolet light generation apparatus including:
- a target substance replenishment device;
- a third container configured to melt a solid target substance replenished by the target substance replenishment device to produce a molten target substance;
- a nozzle configured to output the molten target substance;
- a laser device configured to irradiate, with pulse laser light, the molten target substance reaching a predetermined region after being output from the nozzle; and
- an EUV light concentrating mirror configured to concentrate extreme ultraviolet light emitted from plasma generated in the predetermined region,
- the target substance replenishment device including:
- a first container configured to contain the solid target substance;
- a first path through which the solid target substance supplied from the first container passes;
- a first supply switching device capable of switching between a first state in which supply of the solid target substance from the first container to the first path is suppressed and a second state in which the supply of the solid target substance from the first container to the first path is allowed;
- a first valve connected to the first path;
- a second path which is connected to the first valve and through which the solid target substance having passed through the first valve passes;
- a first detector configured to output a first detection signal indicating that the second path is clogged with the solid target substance; and
- a processor configured to control the first supply switching device to the first state based on the first detection signal.

* * * * *